United States Patent
Lee et al.

(10) Patent No.: US 12,189,306 B2
(45) Date of Patent: *Jan. 7, 2025

(54) METHOD AND SYSTEM OF SURFACE TOPOGRAPHY MEASUREMENT FOR LITHOGRAPHY

(71) Applicant: TAIWAN SEMICONDUCTOR MANUFACTURING COMPANY LTD., Hsinchu (TW)

(72) Inventors: Yung-Yao Lee, Hsinchu County (TW); Yeh-Chin Wang, Taipei (TW); Yang-Ann Chu, Hsinchu (TW); Yung-Hsiang Chen, Hsinchu County (TW); Yung-Cheng Chen, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/491,831

(22) Filed: Oct. 23, 2023

(65) Prior Publication Data
US 2024/0045343 A1 Feb. 8, 2024

Related U.S. Application Data

(63) Continuation of application No. 18/051,016, filed on Oct. 31, 2022, now Pat. No. 11,835,866, which is a
(Continued)

(51) Int. Cl.
*G03F 7/00* (2006.01)
*G01N 21/95* (2006.01)

(52) U.S. Cl.
CPC ..... *G03F 7/70641* (2013.01); *G01N 21/9501* (2013.01)

(58) Field of Classification Search
CPC .................. G03F 7/70641; G01N 21/9501
See application file for complete search history.

(56) References Cited

U.S. PATENT DOCUMENTS

| | | | |
|---|---|---|---|
| 5,696,383 A | 12/1997 | Cheng | |
| 8,411,254 B2 | 4/2013 | De Nivelle | |
| 11,835,866 B2 * | 12/2023 | Lee ................... | G01N 21/9501 |

FOREIGN PATENT DOCUMENTS

TW  202002075 A  1/2020

OTHER PUBLICATIONS

Notice of Allowance, Cited References and Search Report dated Mar. 29, 2024 issued by the Taiwan Intellectual Property Office for the Taiwan Counterpart Application No. 111106867.
(Continued)

*Primary Examiner* — Hung V Nguyen
(74) *Attorney, Agent, or Firm* — WPAT LAW; Anthony King

(57) ABSTRACT

A method includes providing a workpiece to a semiconductor apparatus, the workpiece including a material layer including a first strip having: a first plurality of exposure fields; and a second plurality of exposure fields alternatingly arranged with the first plurality of exposure fields. The method further includes: scanning the first strip along a first scan route from a first side of the workpiece to a second side of the workpiece to generate first topography measurement data; scanning the first strip along a second scan route from the second side to the first side to generate second topography measurement data; and exposing the first plurality of exposure fields and exposing the second plurality of exposure fields according to the first topography measurement data and the second topography measurement data.

20 Claims, 13 Drawing Sheets

Related U.S. Application Data continuation of application No. 17/400,666, filed on Aug. 12, 2021, now Pat. No. 11,487,210.

(56) References Cited

OTHER PUBLICATIONS

U.S. Pat. No. 11,094,556 is the US counterpart of TW 202002075 A.

* cited by examiner

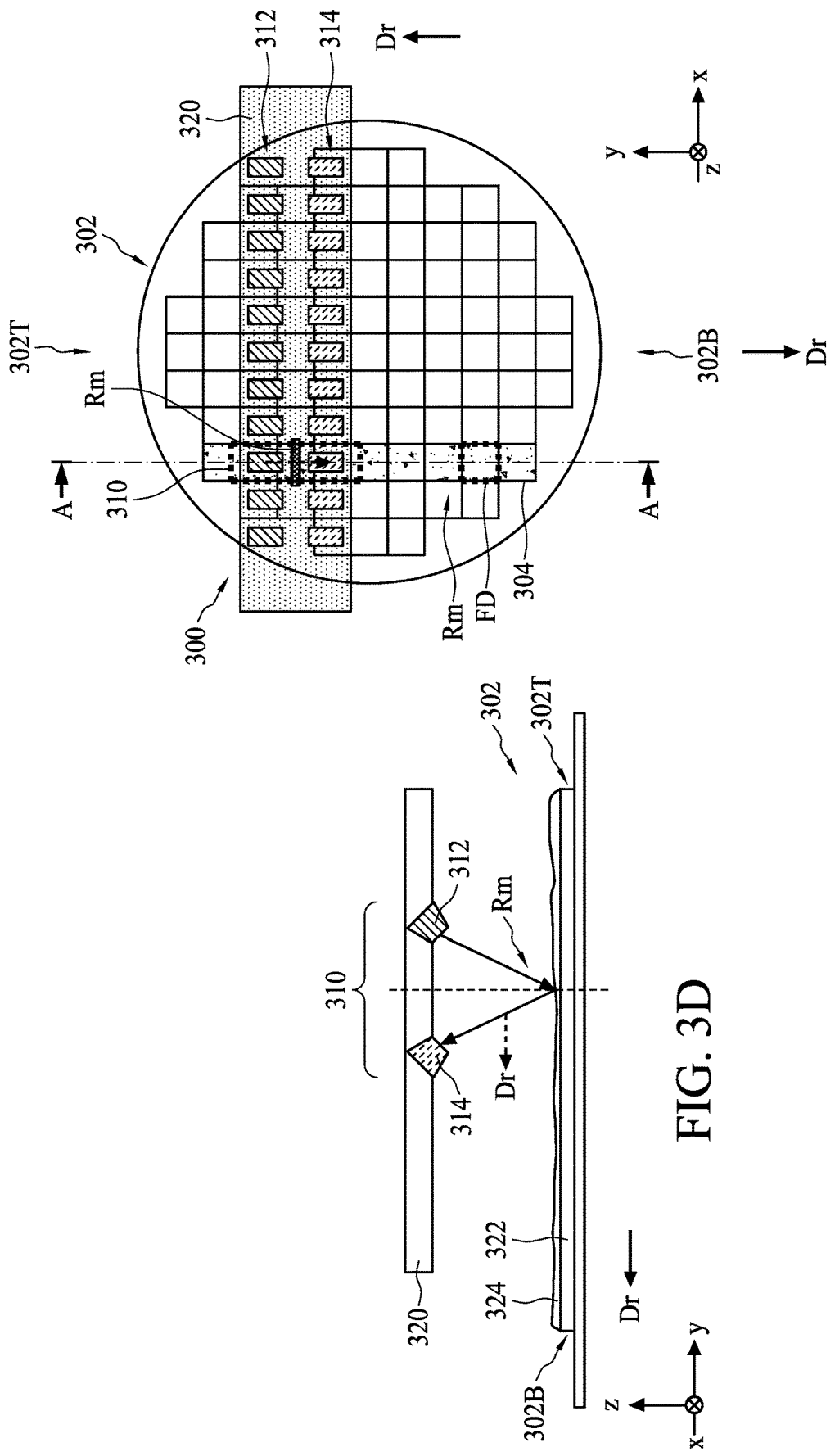

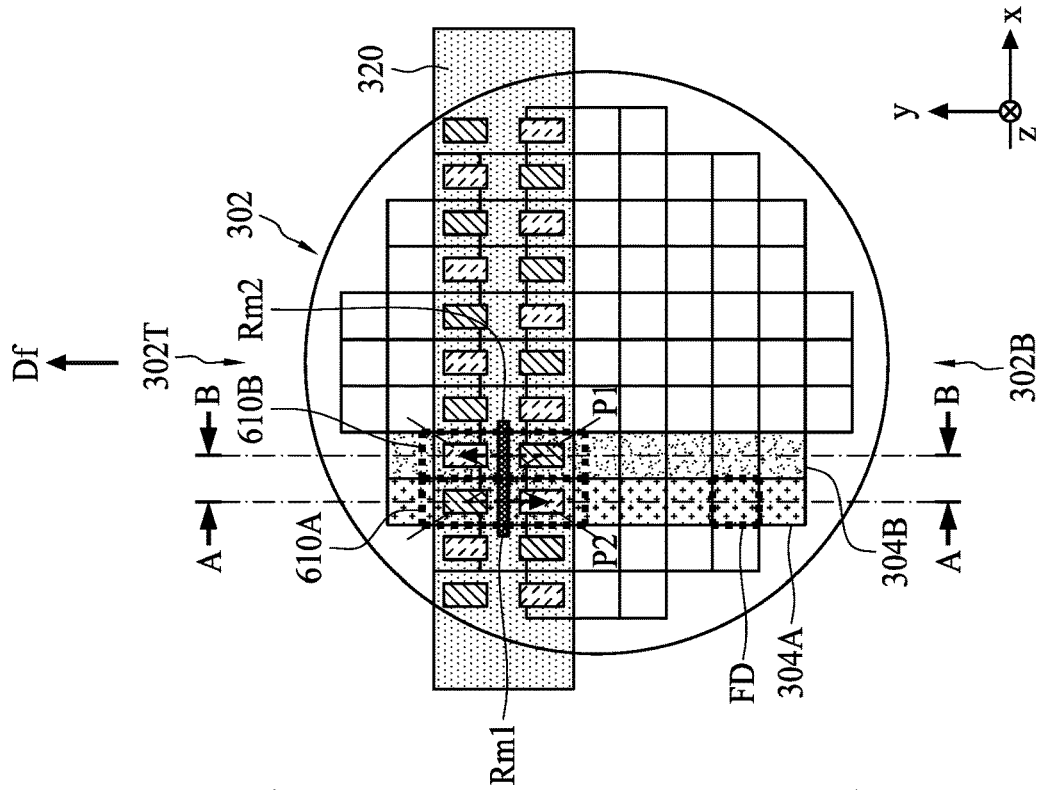
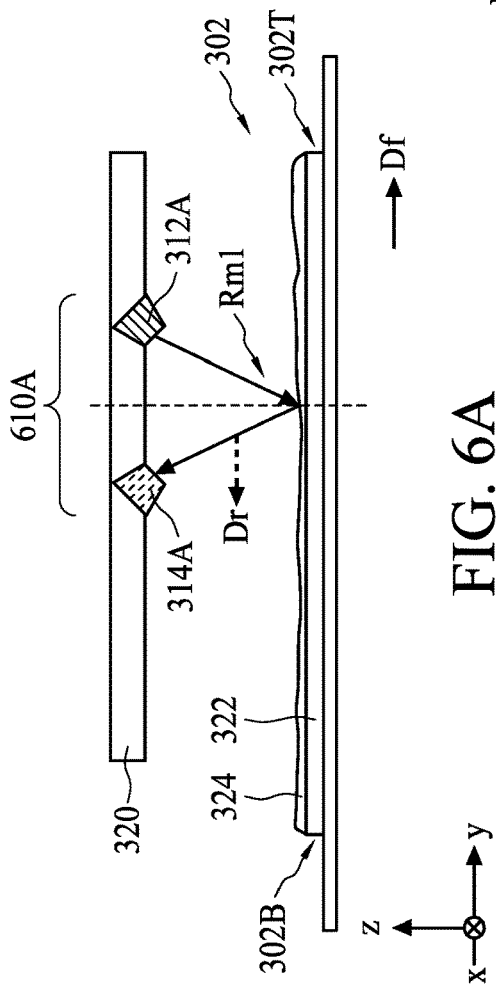
FIG. 6A
FIG. 6B
FIG. 6C

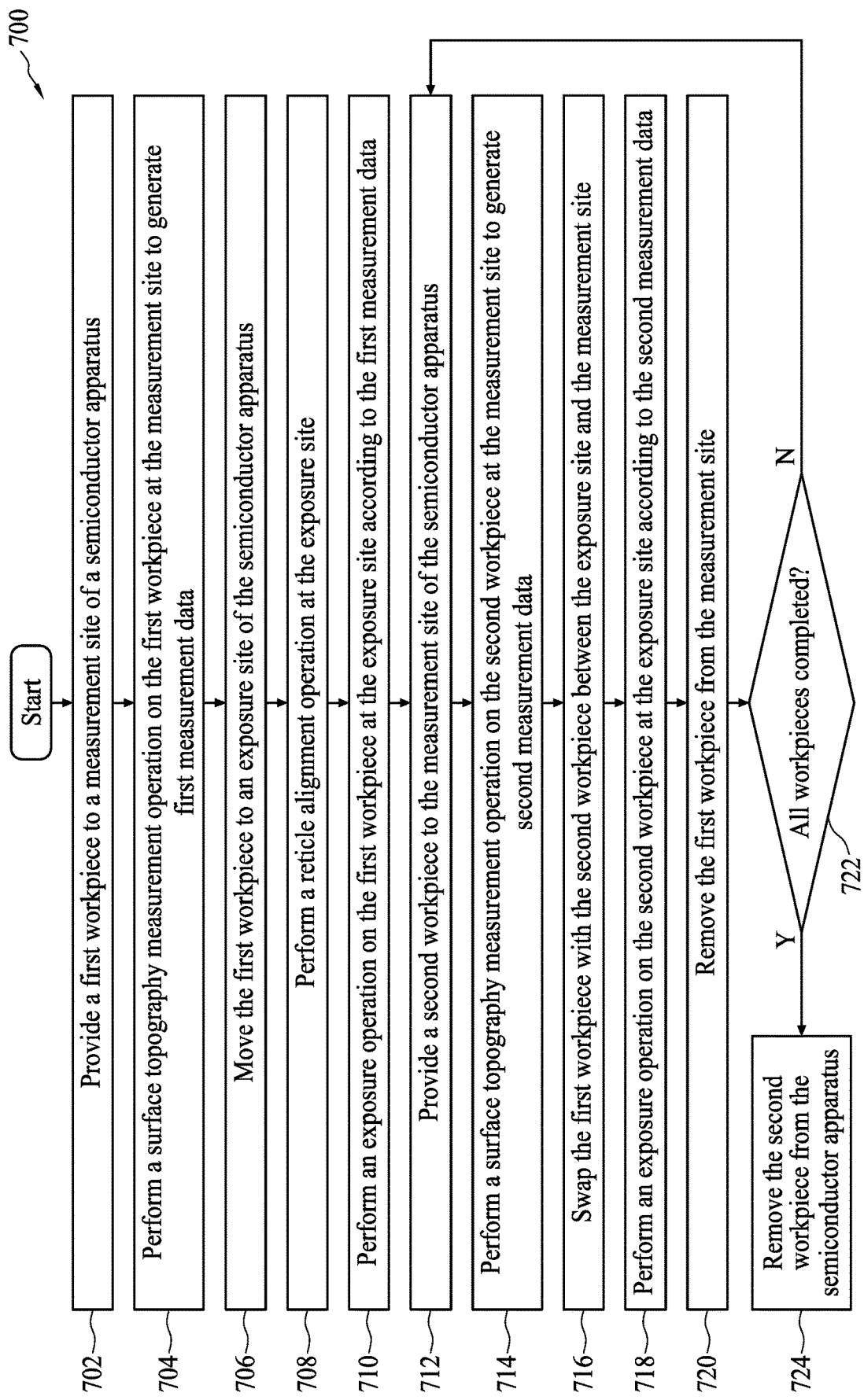

METHOD AND SYSTEM OF SURFACE TOPOGRAPHY MEASUREMENT FOR LITHOGRAPHY

PRIORITY CLAIM AND CROSS-REFERENCE

This application is a continuation application of U.S. non-provisional application Ser. No. 18/051,016 filed Oct. 31, 2022, which is a continuation application of U.S. non-provisional application Ser. No. 17/400,666 filed Aug. 12, 2021, now U.S. Pat. No. 11,487,210 B1, the disclosures of which are hereby incorporated by reference in their entirety.

BACKGROUND

The manufacturing of semiconductor integrated circuits with increased device densities is becoming increasingly complicated. Among the various semiconductor processing steps for manufacturing the integrated circuits, a patterning process is widely employed to cause components of the integrated circuits to be formed with desired shapes. Typical patterning processes include a lithography process, which includes coating a photoresist over a material layer that is to be patterned, exposing the photoresist to a patterning light through a lithography mask, and developing the photoresist to form desired patterns. The circuit pattern may be transferred to the material layer through an etching process with the patterned photoresist serving as an etch mask.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 3D and 3E show an elevation view and a top view, respectively, of a level sensor device in a second scan mode of a surface topography measurement operation, in accordance with some embodiments of the present disclosure.

FIGS. 6A and 6B show elevation views of a level sensor device in a third scan mode of a surface topography measurement operation, in accordance with some embodiments of the present disclosure.

FIG. 6C shows a top view of the level sensor device in the third scan mode of the surface topography measurement operation, in accordance with some embodiments of the present disclosure.

FIG. 7 shows a flowchart of a lithography method, in accordance with some embodiments of the present disclosure.

DETAILED DESCRIPTION

Figure 1:
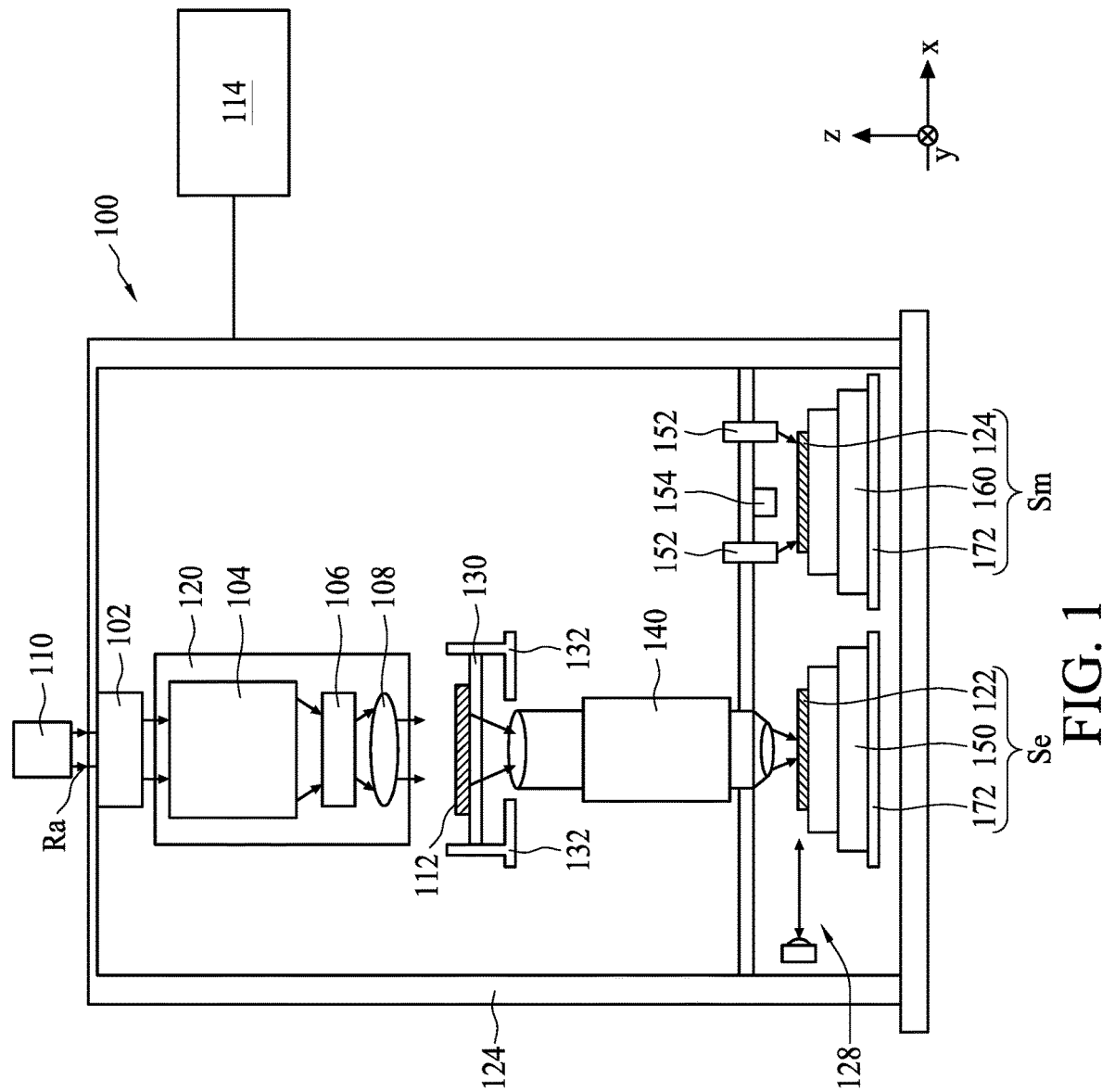
FIG. 1 is a schematic block diagram of a lithography apparatus in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages, such as those for quantities of materials, durations of times, temperatures, operating conditions, ratios of amounts, and the likes thereof disclosed herein, should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

The terms "couple," "coupled" and "coupling" used throughout the present disclosure describe the direct or indirect connections between two or more devices or elements. In some cases, a coupling between at least two devices or elements refers to mere electrical or conductive connections between them and intervening features may be present between the coupled devices and elements. In some other cases, a coupling between at least two devices or elements may involve physical contact and/or electrical connections.

The present disclosure relates generally to a lithography system and a lithography method, and particularly to measurements of a surface topography of a workpiece to be exposed in a lithography operation. The surface topography measurement provides essential parameters of the lithography operation, such as a thickness profile, a tilt angle profile or the like, for each of the exposure fields (or simply "fields" for brevity) of the workpiece to be exposed. However, existing topography measurement methods may not provide adequate scanning speed and accuracy for an advanced technology node. As such, an enhanced level sensor device structure with revised scanning approaches is proposed in the present disclosure for concurrently scanning surfaces of different fields of the workpiece. In addition, scanning angles and scanning routes of the level sensors are arranged such that topography measurement bias can be effectively reduced. Exposure performance can be improved accordingly.

FIG. 1 is a schematic block diagram of a lithography apparatus according to some embodiments of the present disclosure. The lithography apparatus 100 includes a radiation source 110, an illuminator 120, a reticle stage 130, a projection module 140, a first wafer stage 150 and a second wafer stage 160. FIG. 1 illustrates a transmissive-type lithography apparatus 100 according to some embodiments of the present disclosure, but the disclosure is not limited thereto. Other types of lithography apparatus, such as a reflective-type lithography apparatus, may also be within the contemplated scope of the present disclosure.

In some embodiments, the radiation source 110 is configured to emit a radiation beam Ra for the lithography operation. The radiation source 110 may be an excimer laser or a mercury lamp. In an embodiment, the radiation beam Ra has a wavelength between about 100 nm and about 300 nm, or between about 1 nm and about 100 nm, such as 13.5 nm. The radiation source 110 may be integrated in the lithography apparatus 100 or may be formed as a single entity separate from the lithography apparatus 100.

The illuminator 120 is disposed below the radiation source 110 and receives the radiation beam Ra from the radiation source 110. In an embodiment, a beam delivery module 102, which may include beam directing mirrors, is disposed between the radiation source 110 and the illuminator 120 and is configured to direct the radiation beam Ra to the illuminator 120. The illuminator 120 may include a cascade of optical elements for conditioning the incident radiation beam Ra as desired. For example, the illuminator 120 includes a conditioning module 104, a uniformity control module 106 and a condenser 108.

The conditioning module 104 is configured to adjust the angular intensity distribution of the radiation beam Ra, e.g., the outer and/or inner radial extent of the intensity distribution in a pupil plane of the illuminator 120. The conditioning module 104 may include, e.g., a collimator, a field defining element and a field lens group arranged in sequence. In an embodiment, the collimator is used to collimate the radiation beam Ra. In an embodiment, the field defining element is configured to form the radiation beam Ra into a field shape. In an embodiment, the field lens group focuses the radiation beam Ra onto a field plane.

In an embodiment, the uniformity control module 106 receives the radiation beam Ra in the field shape and is configured to manage the intensity profile of the radiation beam Ra. In an embodiment, the uniformity control module 106 includes an array of movable slit fingers to selectively adjust the intensity levels in different locations of the radiation beam Ra. In some embodiments, the condenser 108 is configured to focus the radiation beam Ra onto another field plane.

In an embodiment, the illuminator 120 further includes a masking module (not shown in FIG. 1) between the uniformity control module 106 and the condenser 108. The masking module is configured to ensure that, during exposure of a targeted field, the radiation beam Ra does not leak and illuminate adjacent fields. In an embodiment, the masking module is formed of blades moveable in the scanning direction of the lithography apparatus 100 and configured to control an opening through which the radiation beam Ra can pass.

The reticle stage 130 is disposed below the illuminator 120 and configured to support and secure a reticle 112, also referred to herein as a mask or a photomask. The radiation beam Ra travels through the condenser 108 of the illuminator 120 for illuminating the reticle 112 to thereby form a patterned radiation beam Ra and transfer a circuit pattern to the workpiece 122 according to patterns of the reticle 112.

The projection module 140 is disposed under the reticle stage 130 and is configured to transfer the circuit pattern toward a workpiece 122 on the first wafer stage 150. The projection module 140 may be constructed of one or more mirrors or lenses to project the patterned radiation beam Ra onto the workpiece 122. In an embodiment, the workpiece 122 is a semiconductor substrate and may include a suitable photosensitive material formed thereon. In some embodiments, the workpiece 122 is provided in a form of a semiconductor wafer.

Although the lithography apparatus 100 shown in FIG. 1 includes only the illuminator 120 between the radiation source 110 and the reticle stage 130, other configurations are possible. For example, in a reflective-type lithography apparatus, one or more mirrors may be alternatively or additionally disposed in the propagation path of the radiation beam Ra between the radiation source 110 and the reticle stage 130, either before or after the illuminator 120.

In some embodiments, the lithography apparatus 100 includes a dual-stage design, i.e., including the first wafer stage 150 and the second wafer stage 160, for performing the lithography operation. In some embodiments, both of the first wafer stage 150 and the second wafer stage 160 are allowed to move between an exposure site Se and a measurement site Sm of the lithography apparatus 100. When the first wafer stage 150 or the second wafer stage 160 is moved to the exposure site Se, the workpiece 122 carried by the first wafer stage 150 or a workpiece 124 carried by the second wafer stage 160 is moved to align with the projection module 140 for receiving the patterned radiation beam Ra in an exposure operation. In some embodiments, the lithography apparatus 100 includes a level sensor device 152 and/or an alignment sensor 154 at the measurement site Sm. When the first wafer stage 150 or the second wafer stage 160 is moved to the measurement site Sm, the workpiece 122 carried by the first wafer stage 150 or the workpiece 124 carried by the second wafer stage 160 is subject to one or more preparatory steps, e.g., a surface topography measurement operation or an alignment operation, prior to the exposure operation.

In the depicted embodiment, the first wafer stage 150 is positioned at the exposure site Se, where the workpiece 122 is aligned with the projection module 140 and readied for receiving the patterned radiation beam Ra in the exposure operation. The second wafer stage 160 is positioned at the measurement site Sm, at which the workpiece 124 is subject to a surface topography measurement operation and an alignment operation. In some embodiments, after the exposure operation on the workpiece 122 is completed, the first wafer stage 150 and the second wafer stage 160 are swapped, and the workpiece 122 is removed from the first wafer stage 150 or the lithography apparatus 100, while the second wafer stage 160 with the workpiece 124 is configured to receive a next exposure operation.

In an embodiment, the lithography apparatus 100 includes a location sensor 128 configured to monitor positions of the first wafer stage 150 or the second wafer stage 160. The location sensor 128 may aid in aligning the workpiece 122 or 124 with either the projection module 140 or the level sensor device 152 by providing accurate position data of the wafer stage 150 or 160. In an embodiment, the location sensor 128 may include an interferometric device, a linear encoder, a capacitive sensor or the like.

In some embodiments, the lithography apparatus 100 further includes positioning devices for performing alignment between the workpiece 122 and the reticle 112 so as to transfer the circuit patterns to predetermined positions of the workpiece 122 or 124 with high accuracy. In the present embodiment, a first positioning device 132 is coupled to the reticle stage 130 and configured to move the reticle stage 130 such that the radiation beam Ra can precisely align the reticle 112 in an initialization step or a moving step during an exposure operation. In some embodiments, the reticle 112 includes alignment marks formed thereon for facilitating alignment with the workpiece 122 or 124.

Similarly, the lithography apparatus 100 further includes a second positioning device 172 coupled to the first wafer stage 150 and configured to align the workpiece 122 with the reticle 112. In some embodiments, the workpiece 122 includes an array of exposure fields and includes alignment marks on the sides of the array of exposure fields. The reticle 112 may be aligned with the workpiece 122 by an operation of the second positioning device 172 that causes the alignment marks on the reticle 112 to overlap the corresponding alignment marks on the workpiece 122.

The second positioning device 172 may also be coupled to the second wafer stage 160 and configured to align the workpiece 124 with the level sensor device 152 and the alignment sensor 154. In some embodiments, the workpiece 124 includes an array of exposure fields and includes alignment marks on the sides of the array of exposure fields. The location or orientation of the workpiece 124 may be adjusted through an operation of the positioning device 172 that causes the alignment marks on the workpiece 124 to overlap the alignment sensor 154.

In some embodiments, the lithography apparatus 100 further includes a control device 114 for controlling the sensing, alignment, and exposure operations. The control device 114 may include a processor configured to receive and analyze data generated during the sensing or positioning operations provided by the location sensor 128, the level sensor device 152 or the alignment sensor 154. In some embodiments, the control device 114 may include one or more actuators configured to control operations of the positioning devices 132 and 172. In some embodiments, the control device 114 may include one or more actuators configured to control operations of the radiation source 110, the illuminator 120, the reticle stage 130, the projection module 140, the first wafer stage 150 and the second wafer stage 160. The control device 114 may be implemented by hardware, software, firmware, a combination thereof, or the like, and may include a general-purpose computer, an application specific integrated chip (ASIC), a field programmable gate array (FPGA), a digital signal processor (DSP), a microcontroller, or the like.

Figure 2A:
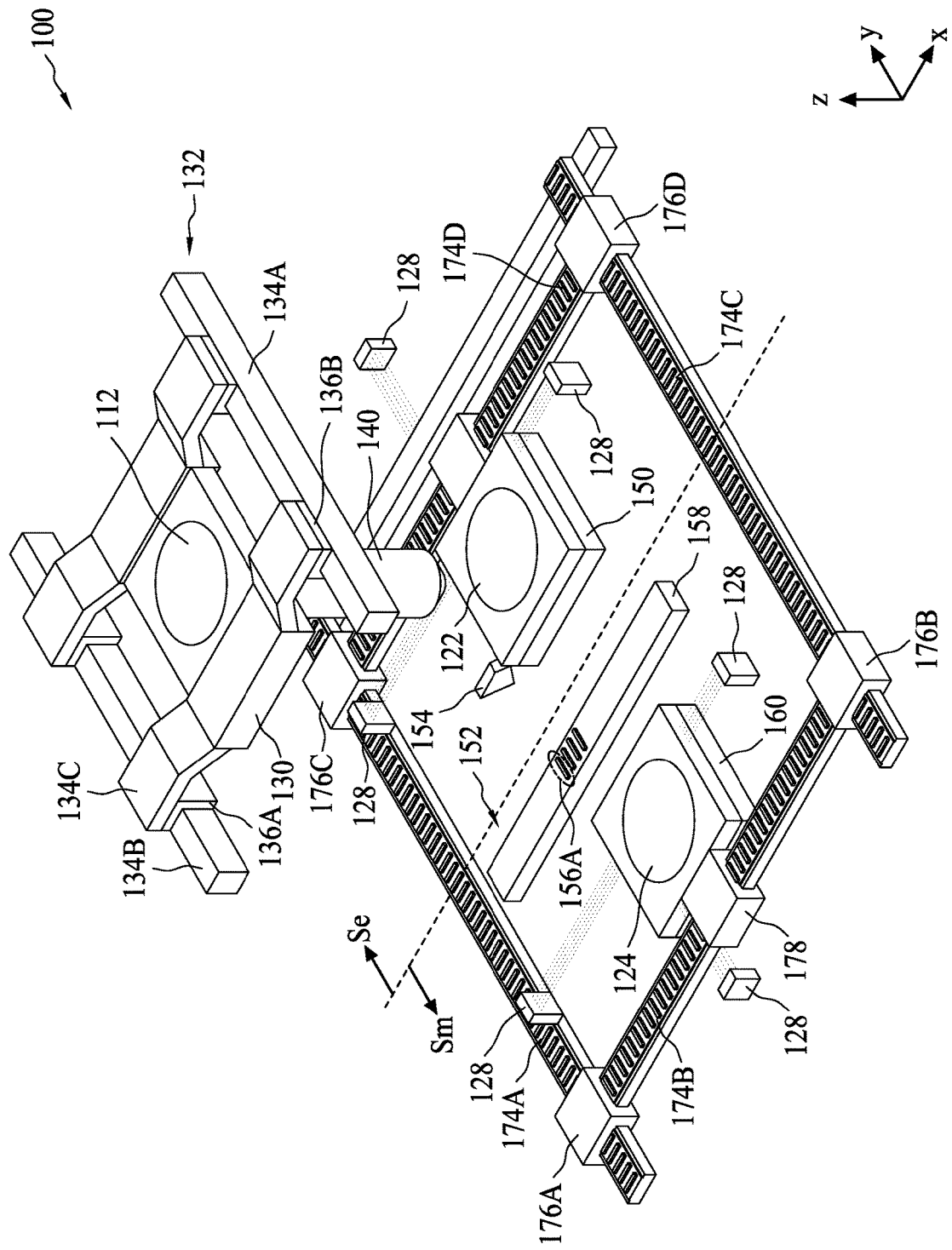
FIG. 2A is an enlarged perspective view of a portion of the lithography apparatus shown in FIG. 1, in accordance with some embodiments of the present disclosure.

FIG. 2A is an enlarged perspective view of a portion of the lithography apparatus 100 shown in FIG. 1, in accordance with some embodiments of the present disclosure. As shown in FIG. 2A, only some features of the lithography apparatus 100 are illustrated, e.g., the reticle 112, the workpieces 122 and 124, the position sensor 128, the reticle stage 130, the first wafer stage 150, the second wafer stage 160, the first positioning device 132 and the second positioning device 172, for providing more details. Other features of the lithography apparatus 100 are omitted from FIG. 2A in order to avoid obscuring other aspects of FIG. 1.

In some embodiments, the first positioning device 132 is arranged at the exposure site Se. The first positioning device 132 supports and secures the reticle stage 130 and is configured to move the reticle stage 130. The first positioning device 132 may include one or more of rails or tracks 134 interconnected to each other through sliding structures 136 for forming a support structure. For example, the first positioning device 132 includes a first rail 134A and a second rail 134B arranged in parallel and extending along the Y-axis, and a third rail 134C extending along the X-axis and interconnected to the first rail 134A and the second rail 134B through corresponding sliding structures 136A and 136B. The sliding structures 136 may be configured to move the reticle stage 130 during an exposure operation to allow the radiation beam Ra to scan across the exposure fields of the workpiece 122. In some embodiments, the sliding structures 136 are configured to move on the rails 134 through mechanical force, electromagnetic force, magnetic levitation, vacuum force, or the like.

The second positioning device 172 is arranged below the first positioning device 132 and extends across the exposure site Se and the measurement site Sm. In some embodiments, the second positioning device 172 includes one or more rails or tracks 174 interconnected through sliding structures 176 and 178, and is configured to move the first wafer stage 150 and the second wafer stage 160 to desired positions. For example, the second positioning device 172 includes a first rail 174A, a second rail 174B, a third rail 174C and a fourth rail 174D interconnected through corresponding sliding structures 176 (i.e., the sliding structures 176A, 176B, 176C and 176D). The second positioning device 172 may further include sliding structures 178 configured to slide on the rails 174, through which the first wafer stage 150 or the second wafer stage 160 is clamped or released during a positioning operation or a stage swap operation. In some embodiments, the sliding structures 176 are configured to slide on the rails 174 through mechanical force, electromagnetic force, magnetic levitation, vacuum force, or the like. In some embodiments, the sliding structures 178 are configured to clamp and release the first wafer stage 150 or the second wafer stage 160 through electromagnetic force, electrostatic force, vacuum force, or the like.

In some embodiments, the second rail 174B is configured to clamp the second wafer stage 160 by the sliding structure 178 and carry the second wafer stage 160 to move along the X-axis through sliding on the second rail 174B, or move along the Y-axis through sliding of the sliding structures 176A and 176B on the first rail 174A and the third rail 174C, respectively. Similarly, the fourth rail 174D is configured to clamp the first wafer stage 150 by another sliding structure (not shown) and carry the first wafer stage 150 to move along the X-axis through sliding on the fourth rail 174D, or move along the Y-axis through sliding of the sliding structures 176C and 176D on the first rail 174A and the third rail 174C, respectively.

During a stage swap operation (also referred to herein as a wafer swap operation), the positions of the first wafer stage 150 and the second wafer stage 160 are swapped thorough operations of the second positioning device 172. For example, the first wafer stage 150 and the second wafer stage 160 are clamped to the fourth rail 174D and the second rail 174B, respectively, and carried to the boundary between the exposure site Se and the measurement site Sm. The sliding structures 178 are configured to release the corresponding one of the first wafer stage 150 and the second wafer stage 160 and capture the other one of the first wafer stage 150 and the second wafer stage 160. As a result, the first wafer stage 150 is clamped to the second rail 174B and the second wafer stage 160 is clamped to the fourth rail 174D to accomplish the stage swap operation.

The level sensor device 152 is arranged over the second wafer stage 160 at the measurement site Sm. In some embodiments, the level sensor device 152 includes a support structure 158 and one or more level sensors 156 arranged on the support structure 158. In some embodiments, during a topography measurement operation, the second wafer stage 160 and the level sensor device 152 cause a relative movement along the Y-axis. In the meantime, the one or more level sensors 156 are configured to scan the surfaces of the workpiece 124. In some embodiments, as shown in FIG. 2A, the support structure 158 extends along the X-axis, and the level sensors 156 are arranged in parallel along the X-axis. In some embodiments, each of the level sensors 156, e.g., an exemplary level sensor 156A, is arranged to extend along the Y-axis. In this way, the parallel level sensors 156 can perform concurrent surface topography measurement operations for saving data measurement time.

Figure 2B:
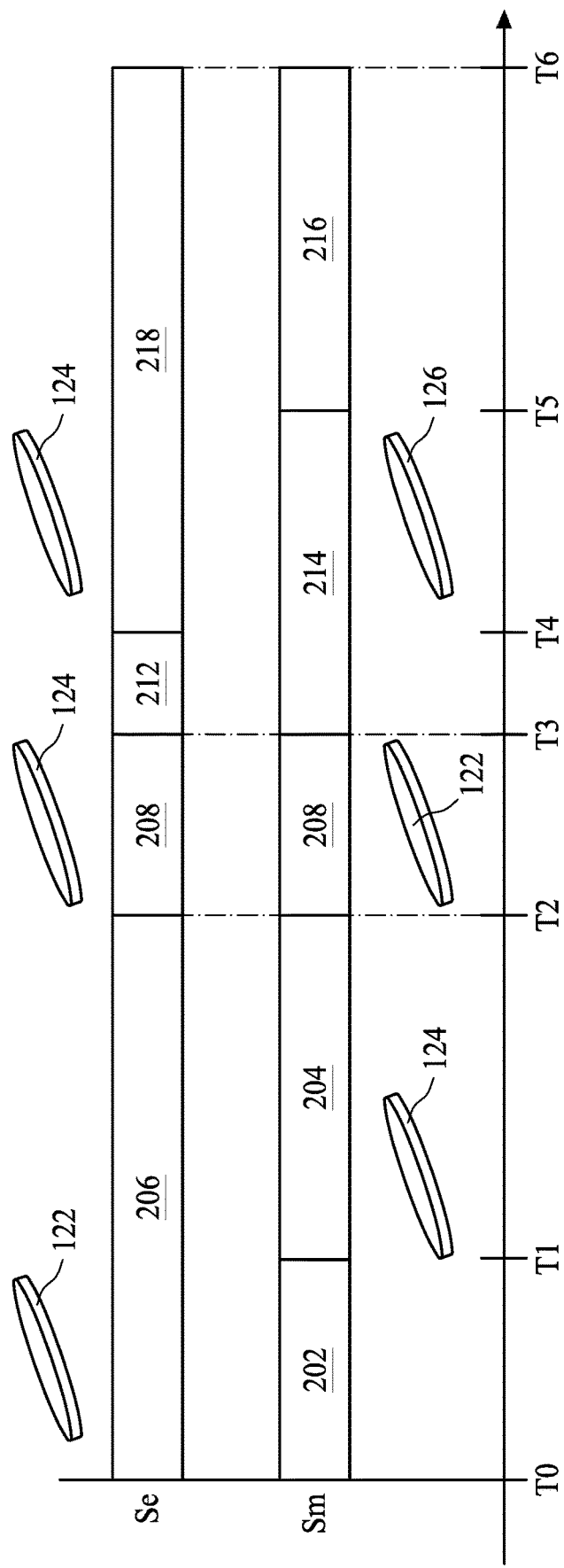
FIG. 2B is a schematic timeline of processing steps in a lithography operation, in accordance with some embodiments of the present disclosure.

FIG. 2B is a schematic timeline of processing steps in a lithography operation, in accordance with some embodiments of the present disclosure. At time instant T0, the workpiece 122 is arranged at the exposure site Se with the presumption that the alignment operation and surface topography measurement operation have been completed. During a time period between time instants T0 and T2, an exposure operation 206 is performed on the workpiece 122 at the exposure site Se. In the meantime, a wafer transport operation 202 is performed from time instant T0 to time instant T1 to move the workpiece 124 from a transport interface to the second wafer stage 160. The second wafer stage 160 is moved to the measurement site Sm with the workpiece 124. Subsequently, during a time period between time instant T1 to time instant T2, a surface topography measurement operation 204 is performed on the workpiece 124. In some embodiments, the measurement data is transmitted to the control device 114 during or after the surface topography measurement operation 204.

In some embodiments, during a time period between time instants T2 and T3, a stage swap operation 208 is performed to swap the workpieces 122 and 144 through swapping the first wafer stage 150 and the second wafer stage 160. In some embodiments, during the stage swap operation 208, the first wafer stage 150 and the second wafer stage 160 are handled and moved by the second positioning device 172 to reach the measurement site Sm and the exposure site Se, respectively.

In some embodiments, subsequent to the positioning operation of the second positioning device 172, during a time period between time instants T3 and T4, a reticle alignment operation 212 is performed to align the reticle 112 with the workpiece 124. In some embodiments, during the reticle alignment operation 212, a radiation preparation operation is performed to ensure that the radiation beam Ra is ready for patterning the workpiece 124. In other embodiments, the radiation preparation operation is performed subsequent to the reticle alignment operation 212.

In some embodiments, during a time period between time instants T4 and T5, an exposure operation 218 is performed on the workpiece 124 at the exposure site Se. In some embodiments, concurrent with the exposure operation 218, the workpiece 122 is removed from the second wafer stage 160 or the measurement site Sm in a wafer transport operation 214, and the first wafer stage 150 is therefore left empty. Subsequently, another workpiece 126 may be transported and received by the first wafer stage 150 during the wafer transport operation 214.

Subsequently, during a time period between time instants T5 and T6, another surface topography measurement operation 216 is performed on the workpiece 126. In some embodiments, the measurement data is transmitted to the control device 114 during or after the surface topography measurement operation 216. The abovementioned operations may be repeated until the lithography operations on all of the workpieces are completed.

Figures 3A, 3B:
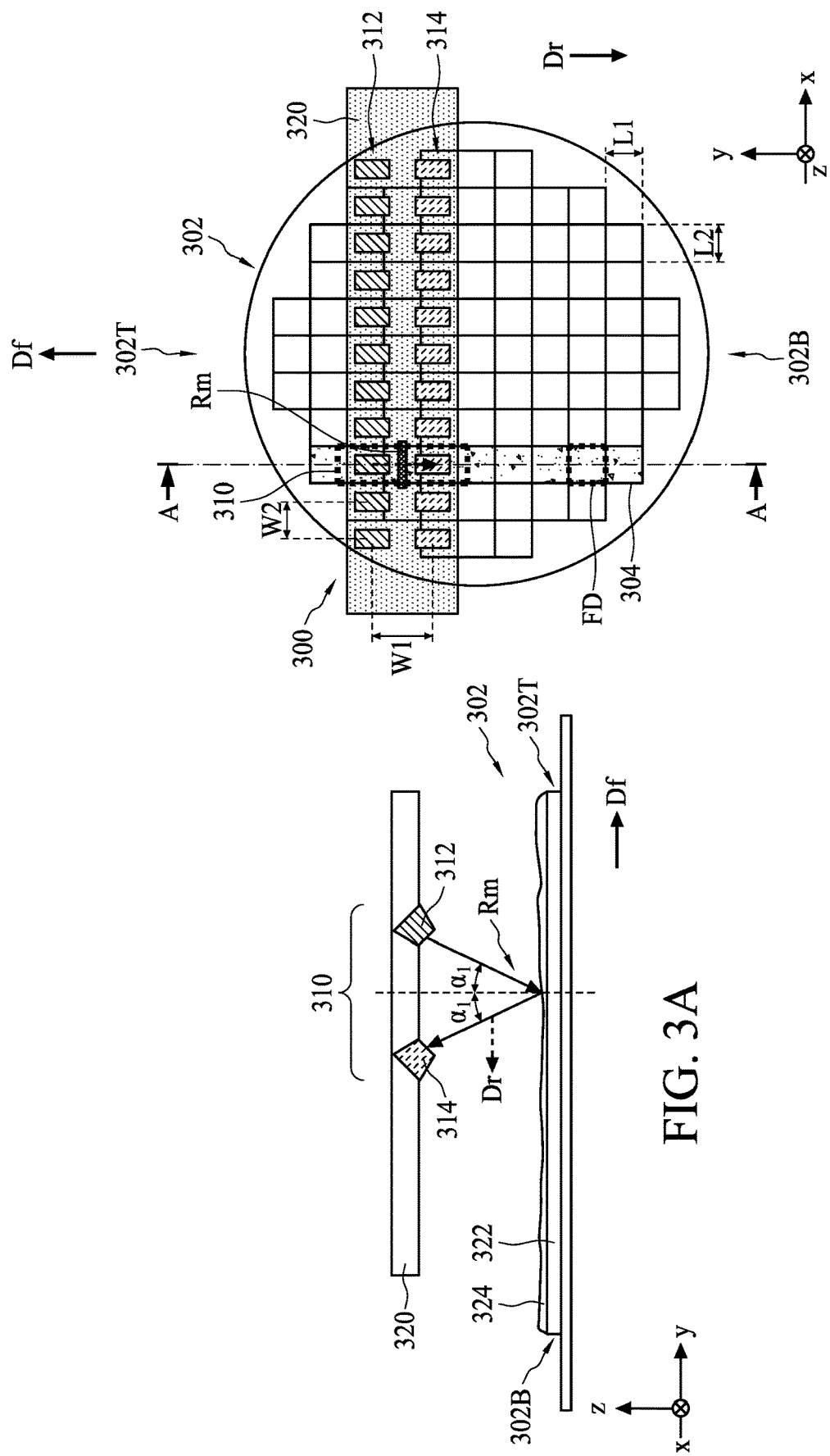
FIGS. 3A and 3B show an elevation view and a top view, respectively, of a level sensor device in a first scan mode of a surface topography measurement operation, in accordance with some embodiments of the present disclosure.

FIGS. 3A and 3B show an elevation view and a top view, respectively, of a level sensor device 300 in a first scan mode of the surface topography measurement operation, in accordance with various embodiments of the present disclosure. FIG. 3A is taken along a section line AA of FIG. 3B. The first scan mode may be employed in the surface topography measurement operation 204 or 216 shown in FIG. 2B.

Referring to FIG. 3A, a workpiece 302 is provided, which is similar to the workpiece 122, 124 or 126 illustrated in FIG. 1, FIG. 2A or FIG. 2B. The workpiece 302 may include a substrate 322 and a material layer 324 deposited over the substrate 322. The substrate 322 is a semiconductor substrate formed of, e.g., silicon, germanium, or other suitable semiconductor substrate materials. In some embodiments, the material layer 324 includes a photosensitive material that can change its chemical composition when exposed to a suitable radiation. The material layer 324 may be a photoresist layer. The material layer 324 may be deposited over the substrate 322 using chemical vapor deposition (CVD), atomic layer deposition (ALD), spin coating, or another suitable deposition method. In some embodiments, the workpiece 302 includes one or more intermediate layers between the material layer 324 and the substrate 322.

Referring to FIG. 3B, the workpiece 302 includes a grid of exposure fields FD from a top-view perspective. In some embodiments, the workpiece 302 defines a plurality of strip areas 304 arranged in parallel and extending along the Y-axis, in which each strip area 304 is formed as a union of contiguous exposure fields FD at a same horizontal position of the workpiece 302. In some embodiments, the lengths of the strip areas 304 in different horizontal positions (along the X-axis) may be different due to a circular shape of the workpiece 302. In the depicted embodiment, the workpiece 302 includes eleven strip areas 304, and a third strip area 304 from a left side of the workpiece 302 includes nine exposure fields FD. In the present disclosure, a specific exposure field FD in the workpiece 302 is referred to by its coordinates in terms of units of the exposure fields FD. For example, the exposure field FD marked with a dashed box in FIG. 3B, which is a second exposure field FD from a bottom in the third strip area 304, is referred to as $FD_{32}$.

The level sensor device 300 may be similar to the level sensor device 152 shown in FIG. 1 and FIG. 2A. In some embodiments, the level sensor device 300 includes a plurality of level sensors 310 and a support structure 320. In some embodiments, the support structure 320 is formed of rigid materials for supporting and securing the level sensors 310. The support structure 320 extends along the X-axis over the workpiece 302. In some embodiments, the level sensor device 300 includes an array of level sensors 310 arranged along the X-axis. Each of the level sensors 310 includes an emitter 312 and a detector 314 arranged in a column extending along the Y-axis. The emitter 312 is configured to emit a sensing light Rm to a surface of the material layer 324, and the sensing light Rm is reflected from the surface of the material layer 324. The detector 314 is configured to receive the sensing light Rm reflected from the surface of the material layer 324. In some embodiments, the emitter 312 includes a light-emitting diode (LED), a laser diode, or another suitable optical transmitter. In some embodiments, the detector 314 includes a photodetector or another suitable optical receiver. In some embodiments, the emitters 312 of the array of the level sensors 310 are arranged in a first row extending along the X-axis, and the detectors 314 of the array of the level sensors 310 are arranged in a second row extending along the X-axis parallel to the first row. In some embodiments, the sensing light Rm emitted by the emitter 312 includes a wavelength or power that will not change the chemical composition of the material layer 324 during a surface topography measurement operation.

During the first scan mode of the surface topography measurement operation, at least one of the workpiece 302 and the level sensor device 300 is moved along the Y-axis to cause a relative movement between the workpiece 302 and the level sensor device 300 along the Y-axis. In some embodiments, the workpiece 302 is moved by the second wafer stage 160 in a positive direction along the Y-axis, which is referred to herein as a forward direction Df, to cause the relative movement between the workpiece 302 and the level sensor device 300. In some embodiments, the level sensor device 300 is moved in a negative direction along the Y-axis, which is referred to herein as a reverse direction Dr opposite to the forward direction Df, to cause the relative movement between the workpiece 302 and the level sensor device 300. With the first scan mode, the surface of the material layer 324 is scanned along the reverse direction Dr from a top exposure field adjacent to a top side 302T of the workpiece 302 to a bottom exposure field adjacent to a bottom side 302B of the workpiece 302.

In some embodiments, the emitter 312 and the detector 314 of each level sensor 310 are arranged in a column along the Y-axis. In other words, the sensing light Rm propagates in a negative direction along the Y-axis, or the reverse direction Dr, from a top-view perspective. In some embodiments, the sensing light Rm is emitted from the emitter 312 to the detector 314 in the reverse direction Dr opposite to the forward direction Df in which the workpiece 302 is moved. In some embodiments, the level sensors 310 are aligned with the corresponding strip areas 304 from a top-view perspective. During a surface topography measurement operation, each level sensor 310 scans a corresponding strip area 304 while the workpiece 302 is moved relative to the level sensor device 300. In some embodiments, the sensing light Rm has a projection of a rectangular shape or an elongated shape on the workpiece 302. In some embodiments, the projection of the sensing light Rm has a length along the X-axis substantially equal to greater than a width of one strip area 304 or one exposure field FD.

Figure 3C:
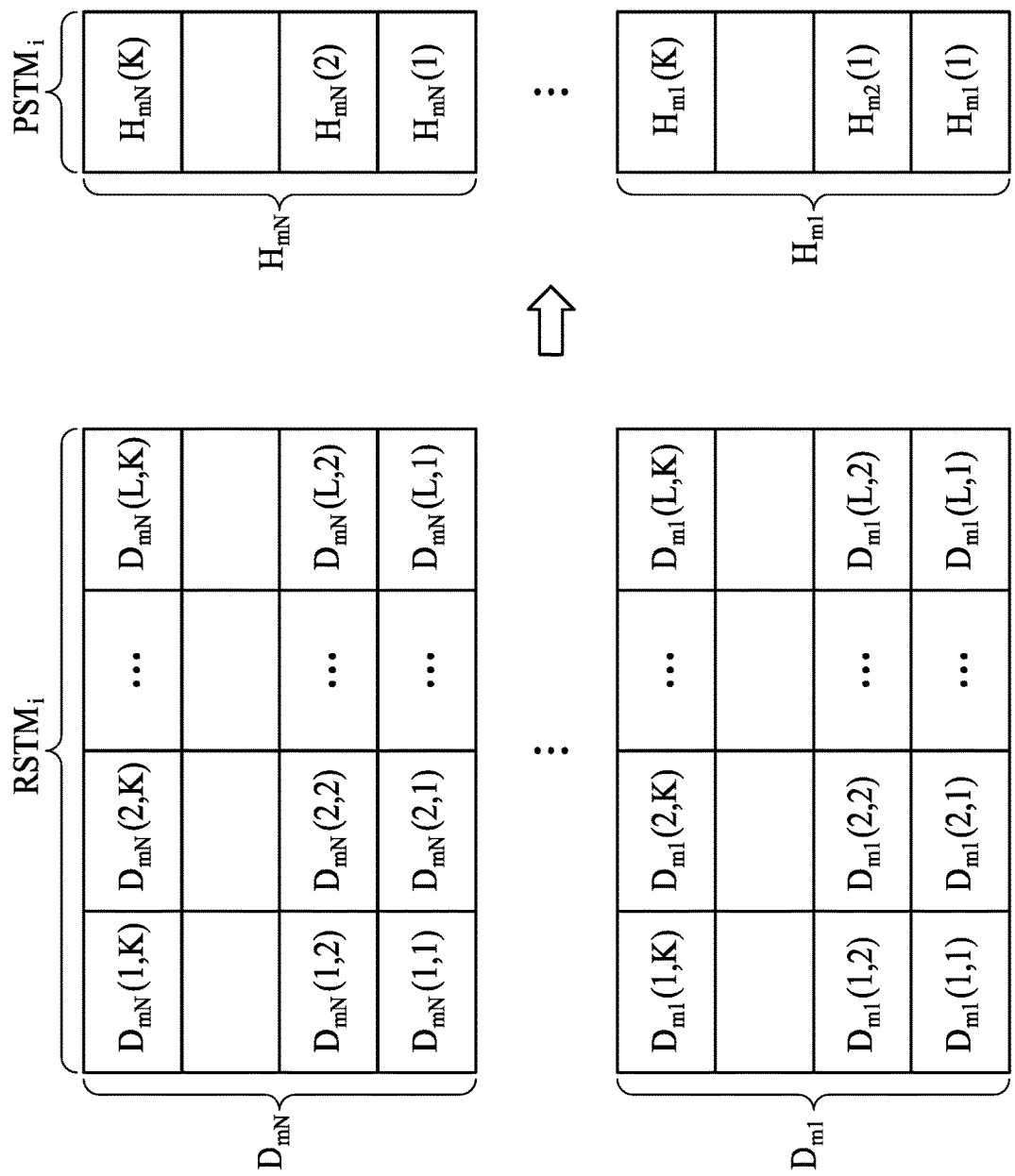
FIG. 3C shows matrices of surface topography measurement data, in accordance with some embodiments of the present disclosure.

FIG. 3C shows matrices of surface topography measurement data, in accordance with some embodiments of the present disclosure. In some embodiments, the outputs of surface topography measurement data for the material layer 324 provided by the level sensor device 300 may be converted from an analog form to a digital form and transmitted to the control device 114. A target exposure field FD may be partitioned into an array of K-by-L measurement spots. Raw data of a surface topography measurement result $D_{mn}(k,l)$ for a target exposure field $FD_{mn}$ may be represented by a K-by-L matrix $D_{mn}$, where a (k,l)-th element of the matrix $D_{mn}$ corresponds to a (k,l)-th measurement spot of the target exposure field $FD_{mn}$.

As illustrated in FIG. 3C, raw data of the surface topography measurement results can be arranged as a cascade of the matrices D for the cascaded exposure fields in the m-th strip area 304, and can be expressed as $RSTM_i=[D_{mN}; D_{m(N-1)}; \ldots D_{m2}; D_{m1}]$, where the variable i represents the i-th scan mode. In some embodiments, the raw surface topography measurement data $RSTM_1$ obtained using the first scan mode is generated by scanning the exposure fields $FD_{mN}, FD_{m(N-1)}, \ldots FD_{m2}, FD_{m1}$ in order.

In some embodiments, raw data of a two-dimensional measurement result $D_{mn}(k,l)$ is further processed to generate a one-dimensional processed surface topography measurement data $PSTM_i$, and can be represented as $PSTMA_i = [H_{mN}; H_{m(N-1)}; \ldots H_{m2}; H_{m1}] = [H_{mN}(K); H_{mN}(K-1); \ldots H_{mN}(1); H_{m(N-1)}(K); H_{m(N-1)}(K-1); \ldots H_{m(N-1)}(1); \ldots H_{m1}(K); H_{m1}(K-1); \ldots H_{m1}(1)]$. In some embodiments, single-column processed surface topography measurement data $PSTM_i$ is generated by averaging the raw data $RSTM_i$ row by row. In some embodiments, the processed surface topography measurement data $PSTM_i$ using the first scan mode is generated in a reverse direction Dr in the order of $H_{mN}(K), H_{mN}(K-1), \ldots H_{mN}(1), H_{m(N-1)}(K), H_{m(N-1)}(K-1), \ldots H_{m(N-1)}(1), \ldots H_{m1}(K), H_{m1}(K-1), \ldots H_{m1}(1)$.

In some embodiments, the two-dimensional raw measurement data $RSTM_i$ of the m-th strip area 304 includes at least one of a height (or thickness) profile and a tilt angle (or slope) profile at each measurement spot of the exposure field $FD_{mn}$ in the m-th strip area 304, n=1, 2, . . . N, in which each exposure field $FD_{mn}$ is associated with a scanning granularity of K-by-L samples. In some embodiments, the processed surface topography measurement data $PSTM_i$ of the m-th strip area 304 includes at least one of a height (or thickness) profile and a tilt angle (or slope) profile along the Y-axis of the exposure field $FD_{mn}$ of the m-th strip area 304, n=1, 2, . . . N, in which each exposure field $FD_{mn}$ is associated with a scanning granularity of L samples along the Y-axis.

FIGS. 3D and 3E show an elevation view and a top view, respectively, of the level sensor device 300 in a second scan mode of the surface topography measurement operation, in accordance with various embodiments of the present disclosure. The second scan mode may be employed in the surface topography measurement operation 204 or 216 shown in FIG. 2B. The settings of the level sensor device 300 for the second scan mode are similar to those used in the first scan mode, and descriptions of such similar aspects are not repeated for brevity. In some embodiments, at least one of the first scan mode or the second scan mode, or both, is employed in the surface topography measurement operation 204 or 216.

In some embodiments, during the second scan mode of the surface topography measurement operation, at least one of the workpiece 302 and the level sensor device 300 is moved along the Y-axis to cause a relative movement between the workpiece 302 and the level sensor device 300 along the Y-axis. The second scan mode is different from the first scan mode in that, in the second scan mode, the workpiece 302 is moved by the second wafer stage 160 in a negative direction along the Y-axis, or equivalently the reverse direction Dr, to cause the relative movement between the workpiece 302 and the level sensor device 300. In some embodiments, the level sensor 300 is moved in a positive direction along the Y-axis, i.e., the forward direction Df, to cause the relative movement between the workpiece 302 and the level sensor device 300. During the second scan mode, the surface of the material layer 324 is scanned from a bottom exposure field adjacent to the bottom side 302B to a top exposure field adjacent to the top side 302T.

Referring to FIG. 3C, similar to the raw surface topography measurement data $RSTM_1$, raw surface topography measurement data $RSTM_2$ for the m-th strip area 304 under the second scan mode can be expressed as $RSTM_2 = [D_{mN}; \ldots D_{m2}; D_{m1}]$. In some embodiments, the raw measurement data $RSTM_2$ obtained using the first scan mode is generated in a forward direction Df by scanning the exposure fields $FD_{m1}, FD_{m2}, \ldots FD_{m(N-1)}, FD_{mN}$ in order. As a result, the one-dimensional processed surface topography measurement data $PSTM_2$ may be generated in an order of $H_{m1}(1), H_{m1}(2), \ldots H_{m1}(K), H_{m2}(1), H_{m2}(2), \ldots H_{m2}(K), H_{mN}(1), H_{mN}(2), \ldots H_{mN}(K)$.

As discussed previously, the relative movement between the level sensor device 300 and the workpiece 302, and the resultant scan route, are at least caused by the movement of the second wafer stage 160 through the positioning device 172. In some embodiments, a first scan route under the first scan mode, which is traversed on the surface of the material layer 324, fully or only partially overlaps a second scan route traversed under the second scan mode. In some embodiments, the first scan route traversed under the first scan mode is close to but not identical to the second scan route traversed under the second scan mode. The reason why the first scan route is not identical to the second scan route may be due to physical constraints of the parts of the second wafer stage 160 and the positioning device 172, in which the constraints may include, but are not limited to, design tolerance of parts, aging, different operating conditions, or the like. As a result, the surface topography measurement data $RSTM_1$ or $PSTM_1$ may be different from the surface topography measurement data $RSTM_2$ or $PSTM_2$.

Figure 4B:
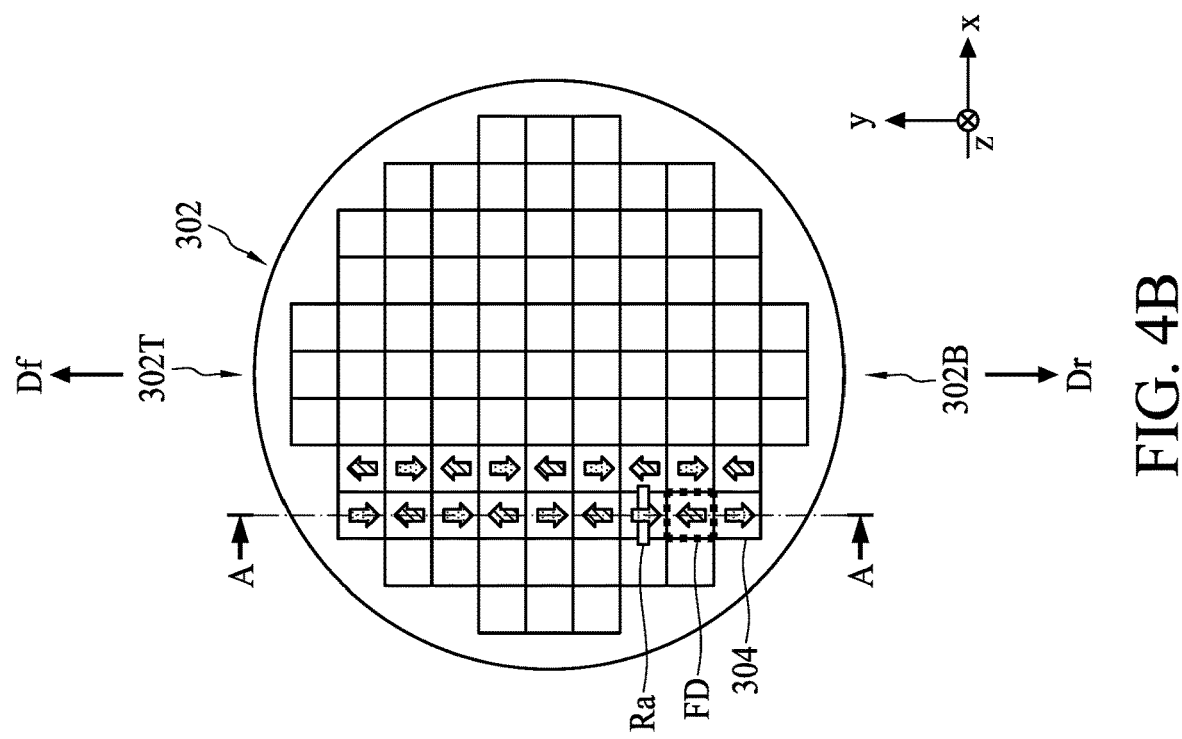
FIGS. 4A and 4B show an elevation view and a top view, respectively, of a workpiece in an exposure operation, in accordance with some embodiments of the present disclosure.
Figure 4A:
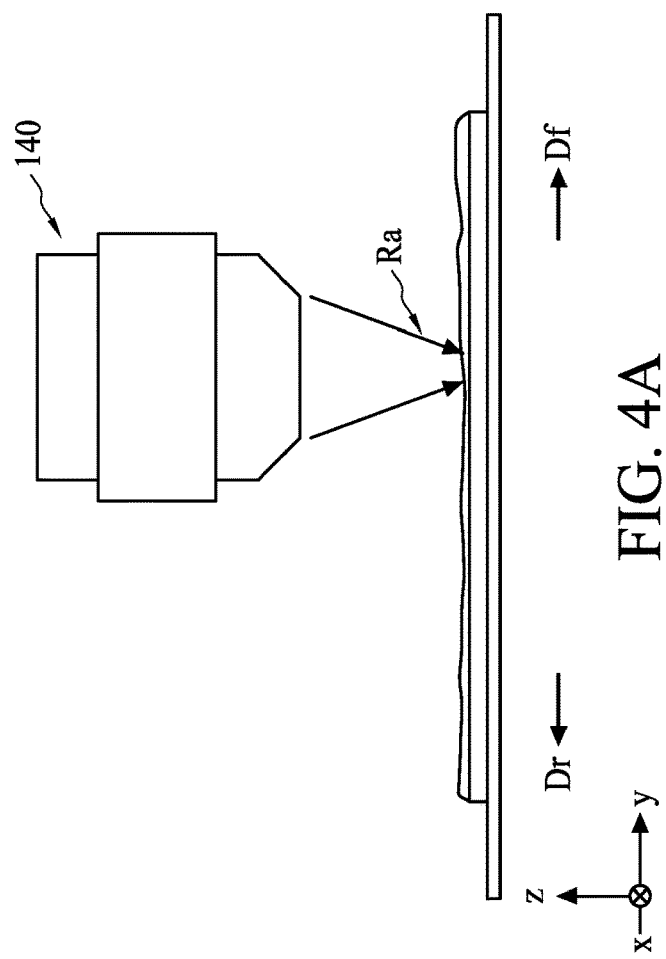

FIGS. 4A and 4B show an elevation view and a top view, respectively, of the workpiece 302 in an exposure operation, in accordance with various embodiments of the present disclosure. The exposure operation discussed in FIGS. 4A and 4B may be similar to the exposure operation 206 or 218 shown in FIG. 2B.

During the exposure operation, at least one of the workpiece 302 and the level sensor device 300 is moved along the Y-axis to cause a relative movement between the workpiece 302 and the level sensor device 300 along the Y-axis. In some embodiments, the workpiece 302 is moved by the second wafer stage 160 in a positive or negative direction along the Y-axis to cause the relative movement between the workpiece 302 and the level sensor device 300. In some embodiments, the projection module 140 is moved in the positive or negative direction along the Y-axis to cause the relative movement between the workpiece 302 and the projection module 140.

In some embodiments, relative movement between workpiece 302 and the projection module 140 causes the radiation beam Ra to scan each of the exposure fields in the workpiece 302 either in the forward direction Df or the reverse direction Dr according to a scan route plan. The scan route plan is determined to reduce the transition time between the exposure operations on consecutive exposure fields FD. The scan route plan may be determined based on one or more factors, e.g., the dimensions of each of the exposure fields FD, the topology of the exposure fields FD in the workpiece 122 or 124, and the exposure settings for each of the exposure fields FD. In the depicted example, adjacent exposure fields FD are assigned with reverse scan directions Df and Dr according to an example scan route plan, such that the projection module 140 can be moved to another exposure field FD and start another shot of exposure with a minimal transition time. In some embodiments, the relative movement between the workpiece 302 and the projection module 140 is accomplished by the movement of the second wafer stage 160 along either the first scan route or the second scan route, just like those used in the first scan mode and the second scan mode for performing surface topography measurement.

When the radiation beam Ra is ready to impinge on a target exposure field FD, the surface topography measurement data $RSTM_1$ or $PSTM_1$ is provided to compensate for the bias of the depth-of-focus (DOF) and tilt angle in each exposure spot of the exposure fields FD. In some embodiments, the control device 114 is configured to provide the surface topography measurement data $RSTM_2$ or $PSTM_2$ for the exposure fields FD that are exposed in the forward direction Df, i.e., both the surface topography measurement operation and the exposure operation are performed along the second scan route, which follows the forward direction Df. Similarly, the control device 114 is configured to provide the surface topography measurement data $RSTM_1$ or $PSTM_1$ for the exposure fields FD that are exposed in the reverse direction Dr, i.e., both the surface topography measurement operation and the exposure operation are performed along the first scan route, which follows the reverse direction Dr. The separate surface topography measurement data $RSTM_1$/$PSTM_1$ or $RSTM_2$/$PSTM_2$ may aid in determining the DOF profile or the tilt angle profile of the radiation beam Ra at different exposure spots of each exposure field FD. The data mismatch due to mismatched scan routes between the measurement operation and the exposure operation can be eliminated or reduced, and the exposure performance can thus be made more accurate and more efficient.

Figure 5:
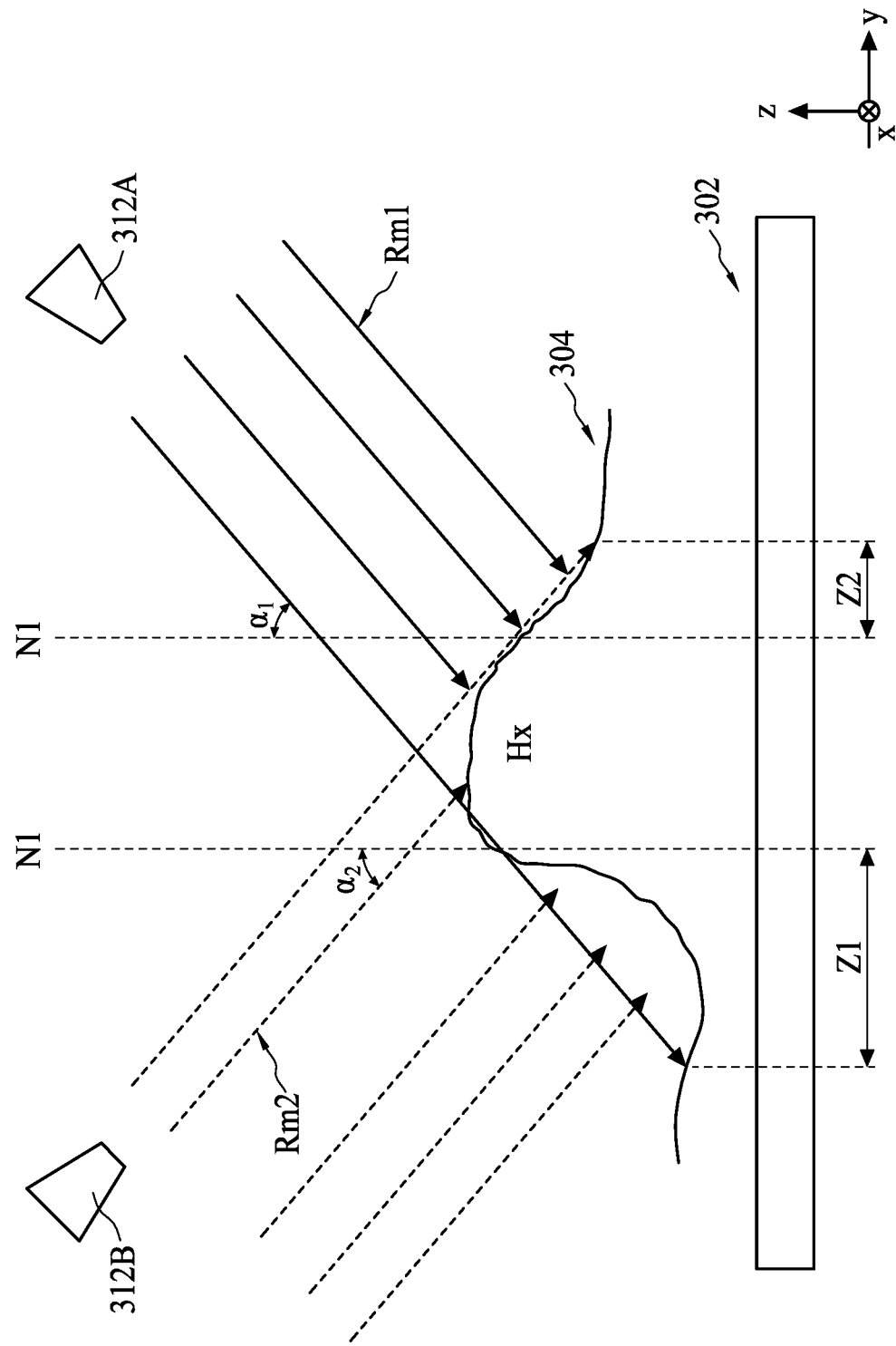
FIG. 5 is a schematic diagram of shadow zones of a workpiece, in accordance with some embodiments of the present disclosure.

FIG. 5 shows a schematic diagram of shadow zones of the workpiece 302 or the material layer 324, in accordance with some embodiments. Two emitters 312A and 312B of the level sensor device 300 are illustrated with respective incident angles $\alpha_1$ and $\alpha_2$ with respect to a normal line N1 perpendicular to the surface of the workpiece 302 or a reference horizontal plane of the workpiece 302. The detector 314 is omitted from FIG. 5 for brevity.

As shown in FIG. 5, as the workpiece 302 is moved to cause a relative movement, either in the forward direction or the reverse direction, between the workpiece 302 and the emitter 312A, a sensing light Rm1 is emitted and incident repeatedly on the surface of the material layer 324 with identical incident angles $\alpha_1$. In some embodiments, the material layer 324 includes a hump portion Hx in the course of the scan route of the sensing light Rm1, and a shadow zone Z1 for the sensing light Rm1 is thus generated around the backside of the hump portion Hx with respect to the emitter 312A. The surface topography measurement result in the shadow zone Z1 may be in error or distorted since the actual surface topography in the shadow zone Z1 is not available under the scheme of the sensing light Rm1.

Similarly, as the workpiece 302 is moved to cause a relative movement between the workpiece 302 and the emitter 312B, a sensing light Rm2 is emitted and incident repeatedly on the surface of the material layer 324 with identical incident angles $\alpha_{12}$. In some embodiments, the incident angles $\alpha_1$ and $\alpha_2$ are substantially equal. Due to the presence of the hump portion Hx in the course of the scan route of the sensing light Rm2, a shadow zone Z2 is thus generated around a backside of the hump portion Hx with respect to the emitter 312B. The surface topography measurement result in the shadow zone Z2 may be in error or distorted.

To reduce or eliminate the measurement errors found in the shadow zone Z1 or Z2, the emitter 312 or the detector 314 is arranged such that the incident angles $\alpha_1$ and $\alpha_2$ are reduced. Referring to FIG. 3A, the incident angle $\alpha_1$ is configured as substantially equal to or less than 30 degrees. In some embodiments, the incident angle $\alpha_1$ is substantially equal to or less than 20 degrees, substantially equal to or less than 10 degrees, or substantially equal to or less than 5 degrees.

Referring to FIG. 3B, the emitter 312 and the detector 314 are spaced by a distance or spacing W1 along the Y-axis. In some embodiments, the distance W1 is no greater than a width L1, measured along the Y-axis, of one exposure field FD. In some embodiments, two adjacent emitters 312 or two adjacent detectors 314 of adjacent level sensors 310 are spaced by a distance or spacing W2 along the X-axis. In some embodiments, the distance W2 is no greater than a width L2, measured along the X-axis, of one exposure field FD. Through the arrangements of the distances or spacing values of the level sensors 310, the incident angle $\alpha_1$ of the sensing light Rm can be reduced. Accordingly, the area of the shadow zone Z1 or Z2 can be decreased.

Referring to FIG. 5, it should be noted that although the surface topography in the shadow zone Z1 cannot be successfully measured by the sensing light Rm1, such shadow zone Z1 is not shadowed from the viewpoint of the sensing light Rm2. Therefore, emitting the sensing light Rm2 from a direction opposite to the sensing light Rm1 in the yz-plane may help resolve the problem of measurement error in the shadow zone Z1. Likewise, emitting the sensing light Rm1 from a direction opposite to the sensing light Rm2 in the yz-plane may help resolve the problem of measurement error in the shadow zone Z2, as explained in greater detail below.

FIGS. 6A and 6B show two elevation views, and FIG. 6C shows a top view, of a level sensor device 600 in a third scan mode of the surface topography measurement operation, in accordance with various embodiments of the present disclosure. FIG. 6A is taken along a section line AA of FIG. 6C, and FIG. 6B is taken along a section line BB of FIG. 6C. The third scan mode may be employed in the surface topography measurement operation 204 or 216 shown in FIG. 2B. The level sensor device 600 shown in FIGS. 6A through 6C is similar to the level sensor device 300 shown in FIGS. 3A and 3B, and descriptions of similar aspects are not repeated for brevity.

The level sensor device 600 includes an array of level sensors 610 arranged on the support structure 320. The level sensor device 600 differs from the level sensor device 300 in the arrangement of the level sensors 610. In some embodiments, the emitters 312 of the array of level sensors 610 are arranged in a staggered manner. Similarly, the detectors 314 of the array of level sensors 610 are arranged in a staggered manner.

In some embodiments, the emitters 312 of the array of level sensors 610 are alternatingly arranged with the detectors 314 along the X-axis. In the depicted embodiment, the workpiece 302 includes exemplary strip areas 304A and 304B adjacent to each other. The level sensor device 600 includes a plurality of first type level sensors 310A and a plurality of second type level sensors 310B alternatingly arranged with the first type level sensors 310A. The order of the emitter 312A and the detector 314A along the Y-axis is opposite to the order of the emitter 312B and the detector 314B along the Y-axis. The two emitters 312A and 312B of the respective level sensors 310A and 310B are arranged on a first diagonal line P1 of a square formed by the level sensors 310A and 310B, while the two detectors 314A and 314B of the respective level sensors 310A and 310B are arranged on another diagonal line P2 of the square.

As illustrated in FIGS. 6A and 6B, the first type level sensors 310A emit the sensing light Rm1 in the reverse direction Dr from a top-view perspective, and the second type level sensors 310B emit the sensing light Rm2 in the forward direction Df from a top-view perspective. In some embodiments, the sensing lights Rm1 and Rm2 of the adjacent level sensors 310A and 310B travel in different directions from a top-view perspective. Referring to FIG. 6C, the sensing lights Rm1 and Rm2 travel in opposite directions from a top-view perspective.

During the third scan mode, the third scan routes for each of the strip areas 304 (including the exemplary strip areas 304A and 304B) shown in FIGS. 6A through 6C are identical to the first scan routes used for scanning each of the strip areas 304 shown in FIGS. 3A and 3B. This is because the relative movements under the first scan mode and the third scan mode are identical, i.e., performed by either the second wafer stage 160 or the level sensor device 300 or 600. In addition, the surface topography measurement results for the odd-numbered strip areas 304 (e.g., the strip area 304A) under the third scan mode may be similar to the surface topography measurement results for the odd-numbered strip areas 304 under the first scan mode. However, since the sensing light Rm2 emitted by the second type level sensor 310B travels in a direction different from, e.g., opposite to, the direction in which the sensing light Rm1 travels from a top-view perspective, the surface topography measurement results for the even-numbered strip areas 304

(e.g., the strip area 304B) may be different from the surface topography measurement results for the even-numbered strip areas 304 under the first scan mode, at least in potential shadow zones for the sensing light Rm1.

Figure 6F:
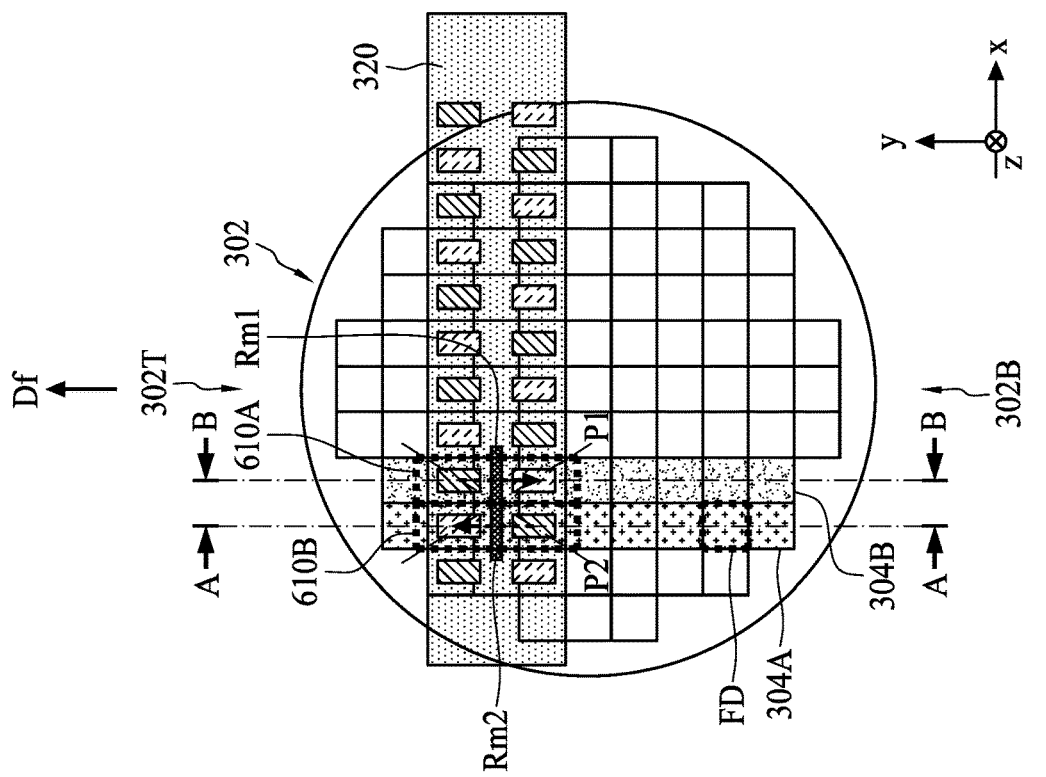
FIG. 6F shows a top view of the level sensor device in the fourth scan mode of the surface topography measurement operation, in accordance with some embodiments of the present disclosure.
Figure 6D:
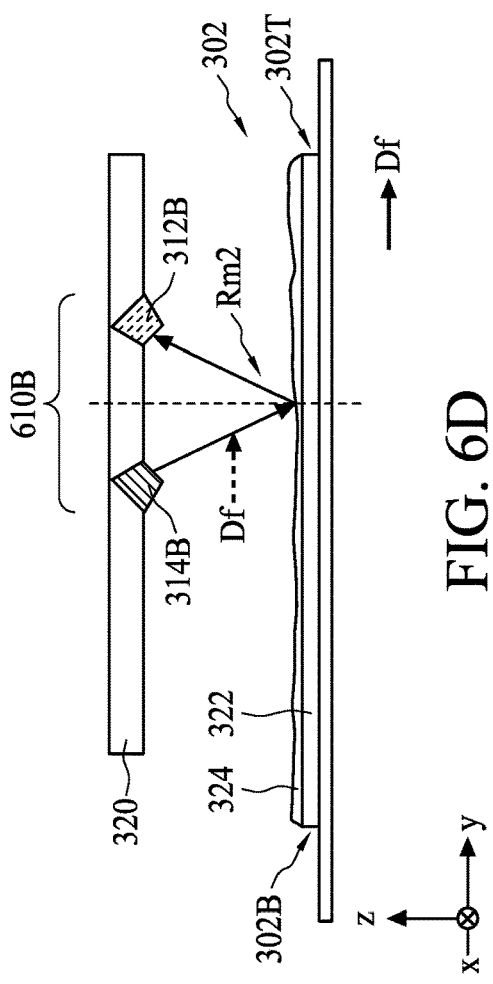
FIGS. 6D and 6E show elevation views of a level sensor device in a fourth scan mode of a surface topography measurement operation, in accordance with some embodiments of the present disclosure.
Figure 6E:
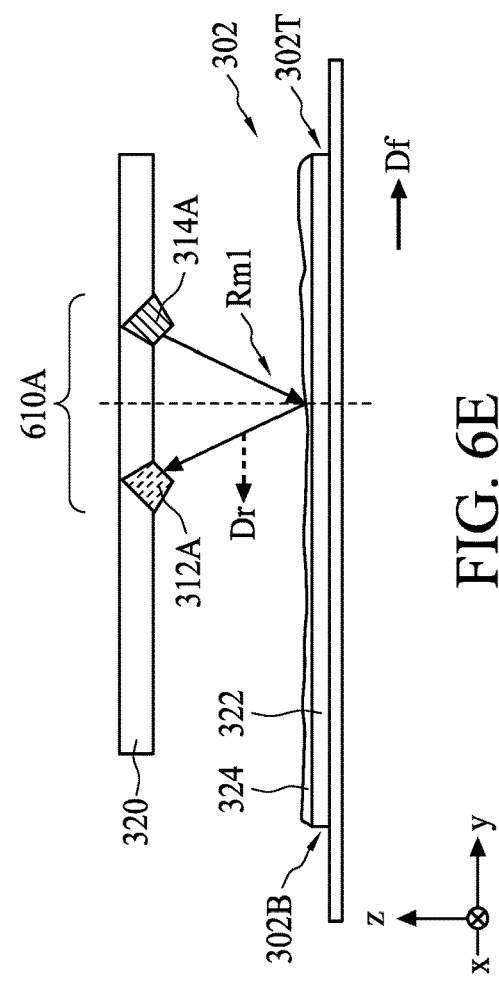

FIGS. 6D and 6E show two elevation views, and FIG. 6F shows a top view, of the level sensor device 600 in a fourth scan mode of the surface topography measurement operation, in accordance with various embodiments of the present disclosure. FIG. 6D is taken along a section line AA of FIG. 6F, and FIG. 6E is taken along a section line BB of FIG. 6F. The fourth scan mode may be employed in the surface topography measurement operation 204 or 216 shown in FIG. 2B.

The surface topography measurement operations performed under the fourth scan mode are similar to those performed under the third scan mode, except that the odd-numbered strip areas 304 (e.g., strip area 304A) are scanned using the sensing light Rm2 emitted by the second type level sensors 310B, while the even-numbered strip areas 304 (e.g., strip area 304B) are scanned using the sensing light Rm1 emitted by the first type level sensors 310A. As a result, through the third scan mode and the fourth scan mode, each strip area 304 is scanned twice by the respective sensing lights Rm1 and Rm2. In some embodiments, the fourth scan mode is performed subsequent to the third scan mode, in which a relative movement is caused between the workpiece 302 and the level sensor device 600 along the X-axis such that the odd-numbered strip areas 304 (e.g., strip area 304A) align with the second type level sensors 610B while the even-numbered strip areas 304 (e.g., strip area 304B) align with the first type level sensors 610A. The measurement results for the shadow zones under one of the third scan mode and the fourth scan mode can be compensated for by the measurement results in the other one of the third scan mode and the fourth scan mode to generate updated measurement results for each of the strip areas 304. Alternatively or additionally, the measurement results for the whole strip area 304 obtained through the third scan mode and the fourth scan mode can be combined, e.g., through an averaging operation, to generate an updated measurement result of the whole respective strip area 304.

In some embodiments, the surface topography measurement performed using the level sensor device 300 under the first scan mode and the second scan mode with reference to FIGS. 3A, 3B, 3D and 3E can be performed using the level sensor device 600 shown in FIGS. 6A through 6F. For example, the first type level sensors 610A share the same configurations as the level sensors 310; however, the number of the first type level sensors 610A is only half the number of the level sensors 310. Therefore, the first scan mode or the second scan mode is accomplished using the level sensor device 600 by performing twice the scanning processes that are performed using the level sensor device 300.

FIG. 7 shows a flowchart of a lithography method 700, in accordance with some embodiments. It shall be understood that additional steps can be provided before, during, and after the steps shown in FIG. 7, and some of the steps described below can be replaced or eliminated, for additional embodiments of the method 700. The order of the steps may be interchangeable. Some of the steps may be performed concurrently or independently.

At step 702, a first workpiece is provided to a measurement site of a semiconductor apparatus. At step 704, a surface topography measurement operation is performed on the first workpiece at the measurement site to generate first measurement data. In some embodiments, the first measurement data includes a thickness profile and a tilt angle profile of a surface of the first workpiece. In some embodiments, the first measurement data is generated according to at least one of a first scan mode, a second scan mode, a third scan mode and a fourth scan mode as discussed with reference to FIGS. 3A, 3B, 3D, 3E, 6A, 6B, 6C, 6D, 6E and 6F.

At step 706, subsequent to the surface topography measurement operation, the first workpiece is moved to an exposure site of the semiconductor apparatus. At step 708, a reticle alignment operation is performed at the exposure site. At step 710, an exposure operation is performed on the first workpiece at the exposure site according to the first measurement data.

At step 712, a second workpiece is provided to the measurement site of the semiconductor apparatus. At step 714, a surface topography measurement operation is performed on the second workpiece at the measurement site to generate second measurement data. In some embodiments, the second measurement data includes a thickness profile and a tilt angle profile of a surface of the second workpiece. In some embodiments, the second measurement data is generated according to at least one of a first scan mode, a second scan mode, a third scan mode and a fourth scan mode as discussed with reference to FIGS. 3A, 3B, 3D, 3E, 6A, 6B, 6C, 6D, 6E and 6F. In some embodiments, steps 712 and 714 are performed concurrently with steps 708 and 710.

At step 716, the first workpiece is swapped with the second workpiece between the exposure site and the measurement site subsequent to the completion of the exposure operation on the first workpiece and the surface topography measurement operation on the second workpiece. In some embodiments, the semiconductor apparatus includes a first wafer stage and a second wafer stage configured to support and carry the first workpiece and the second workpiece, respectively. The swap operation is performed by swapping the first wafer stage with the second wafer stage.

At step 718, an exposure operation is performed on the second workpiece at the exposure site according to the second measurement data. At step 720, the first workpiece is removed from the measurement site or the semiconductor apparatus.

At step 722, it is determined whether all workpieces are completed. If affirmative, the second workpiece is removed from the semiconductor apparatus at step 724 in response to the completion of the exposure operation on the second workpiece. Otherwise, if one or more workpieces are scheduled for receiving the lithography operation, the method 700 may loop back to step 712 to provide another workpiece to the measurement site of the measurement apparatus and proceed with the subsequent steps until all workpieces are completed.

Figure 8:
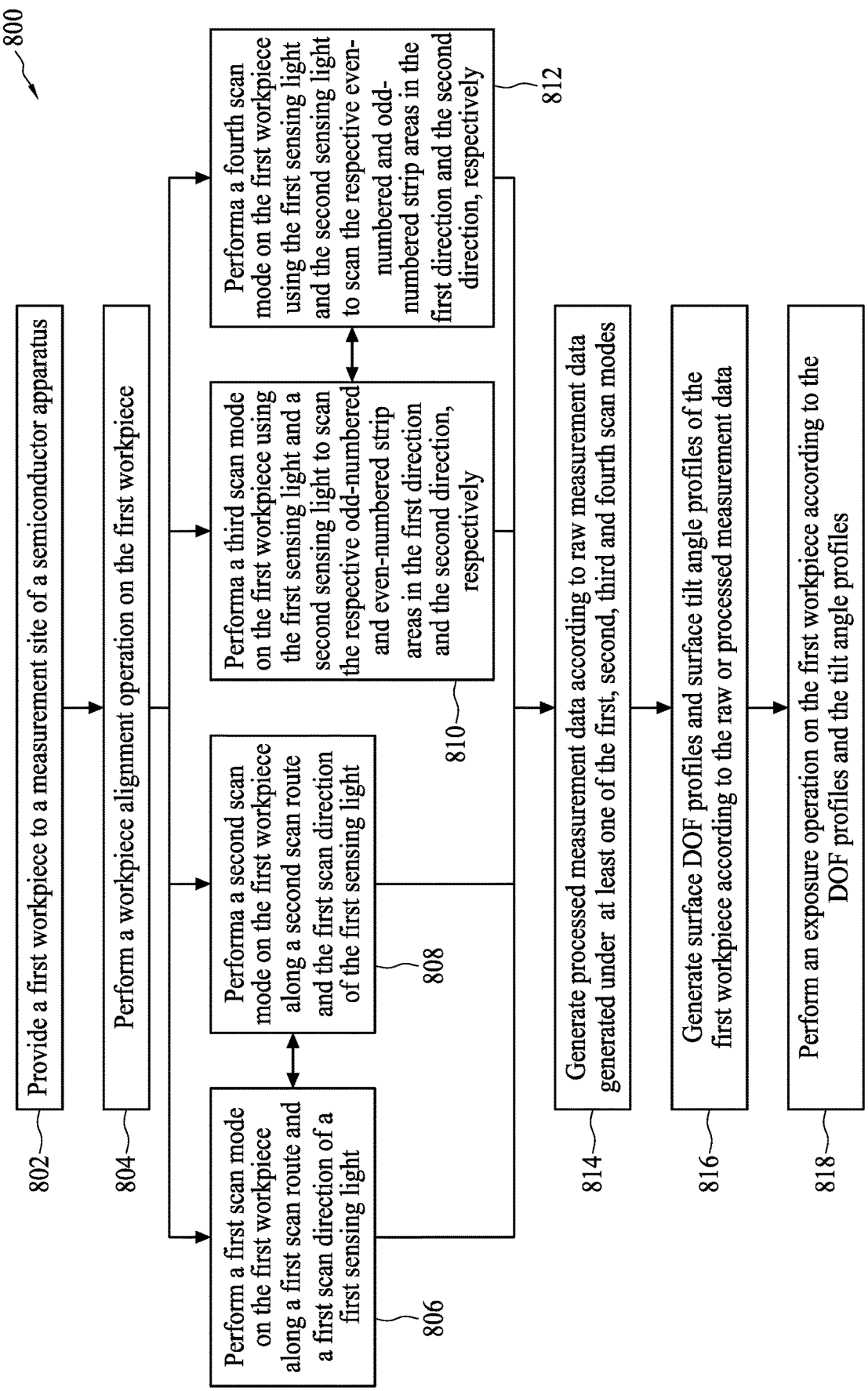
FIG. 8 shows a flowchart of a lithography method, in accordance with some embodiments of the present disclosure.

FIG. 8 shows a flowchart of a lithography method 800, in accordance with some embodiments. It shall be understood that additional steps can be provided before, during, and after the steps shown in FIG. 8, and some of the steps described below can be replaced or eliminated, for additional embodiments of the method 800. The order of the steps may be interchangeable. Some of the steps may be performed concurrently or independently.

At step 802, a first workpiece is provided to a measurement site of a semiconductor apparatus. In some embodiments, step 802 corresponds to step 702 or step 712 of the method 700.

In some embodiments, steps 804, 806, 808, 810 and 812 are related to the surface topography measurement operation described in step 704 or step 714 of the method 700. At step 804, a workpiece alignment operation is performed on the first workpiece. In some embodiments, the workpiece alignment operation includes adjustment of the location and orientation of the first workpiece. Subsequently, one or more of steps 806, 808, 810 and 812 are performed to implement the surface topography measurement operation at step 704 or 714 and generate raw measurement data. At step 806, a first scan mode is performed on the first workpiece along a first scan route with a first scan direction of a first sensing light. At step 808, a second scan mode is performed on the first workpiece along a second scan route with the first scan direction of the first sensing light. In some embodiments, the first scan route may be along a reverse direction, e.g., in a negative direction along the Y-axis, while the second scan route may be along a forward direction, e.g., in a positive direction along the Y-axis. In some embodiments, the first direction of the first sensing light may be the reverse direction, e.g., in the negative direction along the Y-axis.

At step 810, a third scan mode is performed on the first workpiece using the first sensing light and a second sensing light to scan the respective odd-numbered and even-numbered strip areas in the first direction and the second direction, respectively. A third scan route used for all of the strip areas under the third scan mode can be along the forward direction or the reverse direction. In some embodiments, the second direction of the second sensing light may be along the forward direction.

At step 812, a fourth scan mode is performed on the first workpiece using the first sensing light and the second sensing light to scan the respective odd-numbered and even-numbered strip areas in the first direction and the second direction, respectively. A fourth scan route used for all of the strip areas under the fourth scan mode can be along the forward direction or the reverse direction, but is opposite to the direction of the third scan route.

In some embodiments, steps 806, 808, 810 and 812 can be performed in succession in any order.

At step 814, processed measurement data is generated according to raw measurement data generated under at least one of the first, second, third and fourth scan modes. In some embodiments, the raw measurement data generated under the first scan mode and the second mode is combined to generate the processed or updated measurement data. In some embodiments, the raw measurement data generated under the third scan mode and the fourth mode is combined to generate the processed or updated measurement data. In some embodiments, the raw measurement data of a shadow zone generated under the third scan mode is replaced with the raw measurement data of such shadow zone generated under the fourth scan mode, to generate the processed or updated measurement data. In some embodiments, the raw measurement data of a shadow zone generated under the fourth scan mode is replaced with the raw measurement data of such shadow zone generated under the third scan mode, to generate the processed or updated measurement data.

At step 816, surface DOF profiles and surface tilt angle profiles of the first workpiece are generated according to the raw measurement data or the processed measurement data. In some embodiments, the surface DOF profile is generated according to the measurement data in a proportional manner or following a linear equation. In some embodiments, the surface DOF profile is generated according to the measurement data following a non-linear equation. For example, for a certain thickness value in the thickness profile greater than a predetermined value, it is determined that such thickness value may not be reliable, and thus is mapped to a corresponding DOF value with a ratio less than a DOF mapping ratio for other thickness values.

At step 818, an exposure operation is performed on the first workpiece according to the surface DOF profiles and the surface tilt angle profiles. The DOF data and tilt angle data of the radiation beam for the exposure operation are determined based on the surface DOF profiles and the surface tilt angle profiles. In some embodiments, step 816 and step 818 correspond step 710 or step 718 of the method 700.

Figure 9:
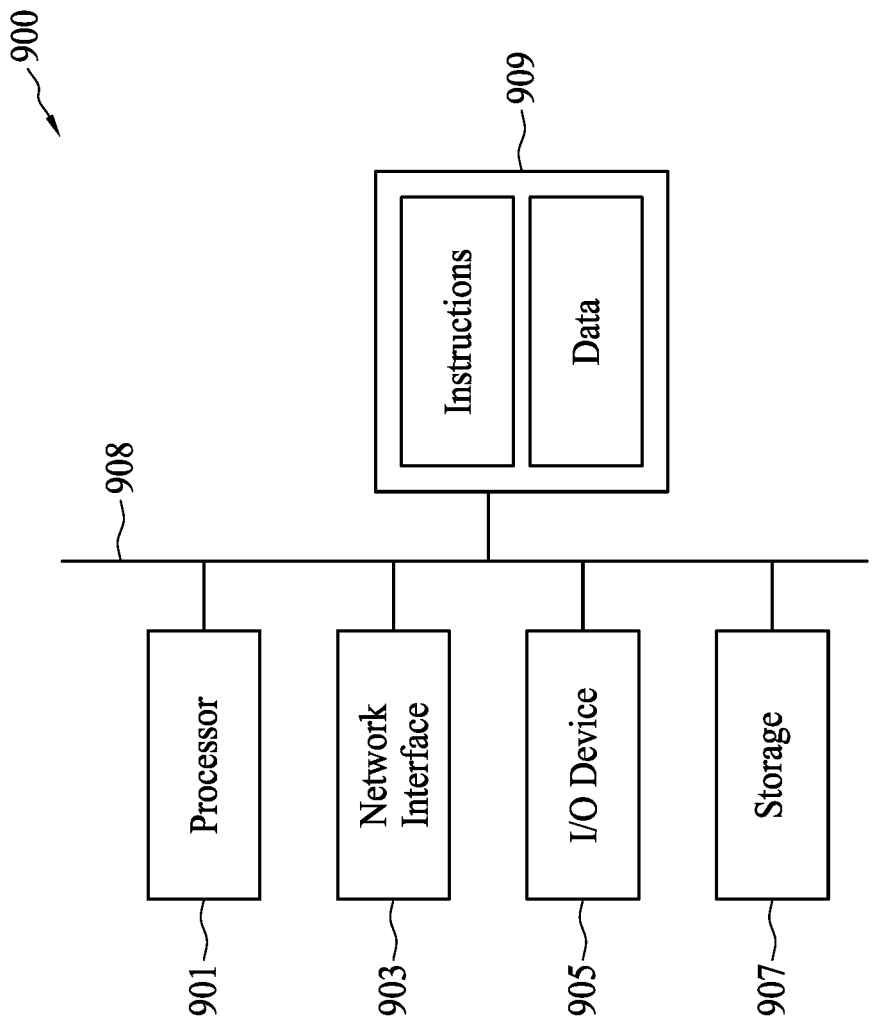
FIG. 9 is a schematic diagram of a system implementing a lithography method, in accordance with some embodiments of the present disclosure.

FIG. 9 is a schematic diagram of a system 900 for implementing a lithography method, in accordance with some embodiments. The system 900 includes a processor 901, a network interface 903, an input and output (I/O) device 905, a storage 907, a memory 909, and a bus 908. The bus 908 couples the network interface 903, the I/O device 905, the storage 907, the memory 909 and the processor 901 to each other.

The processor 901 may correspond to or be included in the control device 114. The processor 901 is configured to execute program instructions configured to perform the steps in the lithography method as described and illustrated with reference to figures of the present disclosure. In some embodiments, the processor 901 is configured to control sensing, acquisition and processing of the surface topography measurement data. In some embodiments, the processor 901 is configured to control alignment and moving of the wafer stage, the reticle stage and the level sensor device.

The network interface 903 is configured to access program instructions and data accessed by the program instructions stored remotely through a network (not shown). In some embodiments, the network interface 903 connects the processor 901 to parts of the lithography apparatus. In some embodiments, the network interface 903 connects the lithography apparatus to external devices.

The I/O device 905 includes an input device and an output device configured for enabling user interaction with the system 900. In some embodiments, the input device includes, for example, a keyboard, a mouse, a trackball, a touchpad, a fingerprint sensor, and other devices. Moreover, the output device includes, for example, a display, a printer, and other devices.

The storage device 907 is configured for storing program instructions and data, e.g. the surface topography measurement data or other control data, accessed by the program instructions. In some embodiments, the storage device 907 includes a non-transitory computer readable storage medium, for example, a magnetic disk and an optical disk.

The memory 909 is configured to store program instructions to be executed by the processor 901 and store data accessed by the program instructions. In some embodiments, the memory 909 includes any combination of a random-access memory (RAM), some other volatile storage device, a read only memory (ROM), and some other non-volatile storage device.

Some embodiments of the present disclosure provide a method. The method includes providing a workpiece to a semiconductor apparatus, the workpiece including a material layer, wherein the material layer includes a first strip includes: a first plurality of exposure fields; and a second plurality of exposure fields alternatingly arranged with the first plurality of exposure fields, the first plurality of exposure fields configured to be exposed in a first direction opposite to a second direction in which the second plurality of exposure fields are configured to be exposed. The method further includes: scanning the first strip along a first scan route from a first side of the workpiece to a second side of the workpiece to generate first topography measurement data; scanning the first strip along a second scan route from the second side to the first side to generate second topography measurement data; and exposing the first plurality of exposure fields and exposing the second plurality of exposure fields according to the first topography measurement data and the second topography measurement data.

Some embodiments of the present disclosure provide a method. The method includes providing a workpiece to a semiconductor apparatus, the workpiece including a material layer, wherein the material layer includes a plurality of strips, wherein each of the strips includes a first exposure field configured to be exposed in a first direction and a second exposure field configured to be exposed in a second direction different from the first direction, wherein the first exposure field and the second exposure field are adjacent to each other in the respective strip. The method further includes: scanning the first exposure field of each of the plurality of strips along a first route and a second route different from the first route within the respective strip to generate first topography measurement data; scanning the second exposure field of each of the plurality of exposure fields along the first route and the second route within the respective strip to generate second topography measurement data; and exposing the first exposure field and the second exposure field in the first direction and the second direction, respectively, according to the first topography measurement data and the second topography measurement data, respectively.

Some embodiments of the present disclosure provide a semiconductor apparatus. The semiconductor apparatus includes a stage configured to support a workpiece, the workpiece including a material layer, wherein the material layer includes a strip having a first exposure field configured to be exposed in a first direction and a second exposure field configured to be exposed in a second direction different from the first direction. The semiconductor apparatus further includes a level sensor device over the stage, and a control unit configured to: move the workpiece by the stage to a first site of the semiconductor apparatus; scan the first exposure field along a first route and a second route, different from the first route, in the strip to generate first topography measurement data; scan the second exposure field along the first route and the second route in the strip to generate second topography measurement data; move the workpiece by the stage to a second site of the semiconductor apparatus; and perform an exposure operation on the first exposure field and the second exposure field according to the first topography measurement data and the second topography measurement data.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a workpiece to a semiconductor apparatus, the workpiece comprising a material layer, wherein the material layer includes a first strip comprising:
      a first plurality of exposure fields; and
      a second plurality of exposure fields alternatingly arranged with the first plurality of exposure fields, the first plurality of exposure fields configured to be exposed in a first direction opposite to a second direction in which the second plurality of exposure fields are configured to be exposed;
   scanning the first strip along a first scan route from a first side of the workpiece to a second side of the workpiece to generate first topography measurement data;
   scanning the first strip along a second scan route from the second side to the first side to generate second topography measurement data; and
   exposing the first plurality of exposure fields and exposing the second plurality of exposure fields according to the first topography measurement data and the second topography measurement data.

2. The method of claim 1, further comprising performing an alignment operation on the workpiece prior to the scanning.

3. The method of claim 1, wherein the exposing of the first plurality and the second plurality of exposure fields according to the first topography measurement data and the second topography measurement data comprises:
   determining a surface depth-of-focus (DOF) profile according to the first topography measurement data and the second topography measurement data; and
   exposing each of the first plurality and the second plurality of exposure fields using a radiation beam with respective DOFs according to the surface DOF profile.

4. The method of claim 1, wherein the first scan route travelled is at least partially non-overlapped with the second scan route.

5. The method of claim 1, wherein the scanning along the first scan route and the second scan route is performed by a first sensing light incident on the workpiece in the first direction from a top-view perspective.

6. The method of claim 5, further comprising:
   scanning the first strip along the first scan route from the first side to the second side by a second sensing light incident on the workpiece in the second direction from a top-view perspective to generate third topography measurement data; and
   scanning the first strip along the second scan route from the second side to the first side by the second sensing light incident on the workpiece in the second direction to generate fourth topography measurement data,
   wherein the exposing of the first plurality and the second plurality of exposure fields is further according to the third and fourth topography measurement data.

7. The method of claim 1, wherein the scanning of the first strip in the first direction comprises scanning a plurality of strips, including the first strip, concurrently in a row direction perpendicular to the first direction.

8. The method of claim 7, further comprising
   scanning a second strip of the plurality of strips along a third scan route from the first side to the second side to generate fifth topography measurement data during the scanning of the first strip from the first side to the second side; and
   scanning the second strip along a fourth scan route from the second side to the first side to generate sixth topography measurement data during the scanning of the first strip from the second side to the first side.

9. The method of claim 8, wherein the scanning of the first strip along the first scan route and the second scan route is performed by a third sensing light incident on the workpiece in the second direction from a top-view perspective.

10. The method of claim 9, wherein the scanning of the second strip is performed by a fourth sensing light incident on the workpiece in the first direction from a top-view perspective.

11. A method, comprising:
providing a workpiece to a semiconductor apparatus, the workpiece comprising a material layer, wherein the material layer comprises a plurality of strips, wherein each of the strips includes a first exposure field configured to be exposed in a first direction and a second exposure field configured to be exposed in a second direction different from the first direction, wherein the first exposure field and the second exposure field are adjacent to each other in the respective strip;
scanning the first exposure field of each of the plurality of strips along a first route and a second route different from the first route within the respective strip to generate first topography measurement data;
scanning the second exposure field of each of the plurality of exposure strips along the first route and the second route within the respective strip to generate second topography measurement data; and
exposing the first exposure field and the second exposure field in the first direction and the second direction, respectively, according to the first topography measurement data and the second topography measurement data, respectively.

12. The method of claim 11, wherein the second direction is opposite to the first direction from a top-view perspective.

13. The method of claim 11, wherein the scanning of the first exposure field to generate the first topography measurement data is performed by emitting a first sensing light to the first exposure field in the first direction from a top-view perspective, further comprising scanning the first exposure field by emitting a second sensing light to the first exposure field in the second direction to generate third topography measurement data.

14. The method of claim 13, wherein the first sensing light includes a first incident angle measured between a normal line of the material layer and the first sensing light, and the second sensing light includes a second incident angle measured between the normal line of the material layer and the second sensing light, wherein the first incident angle is substantially equal to the second incident angle.

15. The method of claim 13, further comprising generating fourth topography measurement data by replacing a first portion of the first topography measurement data of a zone of the first exposure field with a second portion of the third topography measurement data of the zone of the first exposure field, wherein the exposing of the first exposure field is performed according to the fourth topography measurement data.

16. The method of claim 11, wherein the first direction and the second direction is parallel to a direction in which each of the strips extends.

17. A semiconductor apparatus, comprising:
a stage configured to support a workpiece, the workpiece comprising a material layer, wherein the material layer includes a strip having a first exposure field configured to be exposed in a first direction and a second exposure field configured to be exposed in a second direction different from the first direction;
a level sensor device over the stage; and
a control unit configured to:
move the workpiece by the stage to a first site of the semiconductor apparatus;
scan the first exposure field along a first route and a second route, different from the first route, in the strip to generate first topography measurement data;
scan the second exposure field along the first route and the second route in the strip to generate second topography measurement data;
move the workpiece by the stage to a second site of the semiconductor apparatus; and
perform an exposure operation on the first exposure field and the second exposure field according to the first topography measurement data and the second topography measurement data.

18. The semiconductor apparatus of claim 17, wherein the level sensor device comprises a plurality of level sensors arranged along a first axis substantially perpendicular to a second axis in which the strip extends, wherein each of the first and second exposure fields includes a first length measured along the first axis, and two adjacent level sensors of the plurality of level sensors are spaced by a first distance no greater than the first length.

19. The semiconductor apparatus of claim 17, wherein the level sensor device comprises a plurality of level sensors arranged along a first axis substantially perpendicular to a second axis in which the strip extends, and each of the level sensors comprises an emitter and a detector, wherein each of the first and second exposure fields includes a second length measured along the second axis, and the emitter and the detector are spaced by a second distance no greater than the second length.

20. The semiconductor apparatus of claim 17, wherein the level sensor device comprises a plurality of level sensors, and the plurality of level sensors comprises respective emitters and detectors, wherein the emitters of the level sensors are arranged in a staggered manner, and the detectors of the level sensors are arranged in a staggered manner.

* * * * *